(12) United States Patent
Watanabe et al.

(10) Patent No.: US 7,569,838 B2
(45) Date of Patent: Aug. 4, 2009

(54) ELECTRON BEAM INSPECTION SYSTEM AND INSPECTION METHOD AND METHOD OF MANUFACTURING DEVICES USING THE SYSTEM

(75) Inventors: Kenji Watanabe, Kanagawa (JP); Hirosi Sobukawa, Kanagawa (JP); Nobuharu Noji, Kanagawa (JP); Tohru Satake, Kanagawa (JP); Shoji Yoshikawa, Tokyo (JP); Tsutomu Karimata, Kanagawa (JP); Mamoru Nakasuji, Kanagawa (JP); Masahiro Hatakeyama, Kanagawa (JP); Takeshi Murakami, Tokyo (JP); Yuichiro Yamazaki, Tokyo (JP); Ichirota Nagahama, Ibaraki (JP); Takamitsu Nagai, Kanagawa (JP); Kazuyoshi Sugihara, Kanagawa (JP)

(73) Assignees: Ebara Corporation, Tokyo (JP); Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/068,484

(22) Filed: Feb. 7, 2008

(65) Prior Publication Data

US 2008/0173814 A1    Jul. 24, 2008

Related U.S. Application Data

(62) Division of application No. 11/290,688, filed on Dec. 1, 2005, now Pat. No. 7,351,969, which is a division of application No. 09/985,317, filed on Nov. 2, 2001, now Pat. No. 6,992,290.

(30) Foreign Application Priority Data

| Jan. 10, 2001 | (JP) | 2001-002722 |
| Mar. 16, 2001 | (JP) | 2001-075865 |
| Mar. 28, 2001 | (JP) | 2001-092748 |
| Apr. 24, 2001 | (JP) | 2001-125349 |
| Jun. 22, 2001 | (JP) | 2001-189325 |

(51) Int. Cl.
*H01J 37/00* (2006.01)
*H01J 37/30* (2006.01)

(52) U.S. Cl. .................. 250/428; 250/306; 250/310; 250/397

(58) Field of Classification Search .................. None
See application file for complete search history.

(56) References Cited

U.S. PATENT DOCUMENTS 4,912,052 A    3/1990    Miyoshi et al.

(Continued)

FOREIGN PATENT DOCUMENTS

JP    09-311112    12/1997

(Continued)

OTHER PUBLICATIONS

Japanese Office Action dated Jan. 4, 2005.
"LSI Testing Symposium/1996; Meeting Minutes" (Nov. 7-8, 1996).

*Primary Examiner*—David A. Vanore
(74) *Attorney, Agent, or Firm*—Westerman, Hattori, Daniels & Adrian, LLP.

(57) ABSTRACT

An electron beam inspection system of the image projection type includes a primary electron optical system for shaping an electron beam emitted from an electron gun into a rectangular configuration and applying the shaped electron beam to a sample surface to be inspected. A secondary electron optical system converges secondary electrons emitted from the sample. A detector converts the converged secondary electrons into an optical image through a fluorescent screen and focuses the image to a line sensor. A controller controls the charge transfer time of the line sensor at which the picked-up line image is transferred between each pair of adjacent pixel rows provided in the line sensor in association with the moving speed of a stage for moving the sample.

5 Claims, 25 Drawing Sheets

U.S. PATENT DOCUMENTS

| | | |
|---|---|---|
| 5,030,908 A | 7/1991 | Miyoshi et al. |
| 5,315,119 A | 5/1994 | Komatsu et al. |
| 5,359,197 A | 10/1994 | Komatsu et al. |
| 5,362,968 A | 11/1994 | Miyoshi et al. |
| 5,363,968 A | 11/1994 | Soloman |
| 5,479,535 A | 12/1995 | Komatsu |
| 5,892,224 A | 4/1999 | Nakasuji |
| 6,038,018 A | 3/2000 | Yamazaki et al. |
| 6,184,526 B1 | 2/2001 | Kohama et al. |
| 6,365,897 B1 | 4/2002 | Hamashima et al. |
| 6,388,261 B1 | 5/2002 | Nakasuji |
| 6,555,815 B2 * | 4/2003 | Feuerbaum et al. ......... 250/310 |
| 6,670,602 B1 | 12/2003 | Kohama et al. |
| 6,683,320 B2 | 1/2004 | Gerlach et al. |

FOREIGN PATENT DOCUMENTS

| | | |
|---|---|---|
| JP | 10-12684 A | 1/1998 |
| JP | 10-255709 A | 9/1998 |
| JP | 10-284394 A | 10/1998 |
| JP | 11-242943 | 9/1999 |
| JP | 11-345585 A | 12/1999 |
| JP | 2000-100364 A | 4/2000 |
| JP | 2000-100369 A | 4/2000 |
| JP | 2000-113848 A | 4/2000 |
| JP | 2000-356512 A | 12/2000 |
| WO | WO 99/50651 | 10/1999 |

* cited by examiner

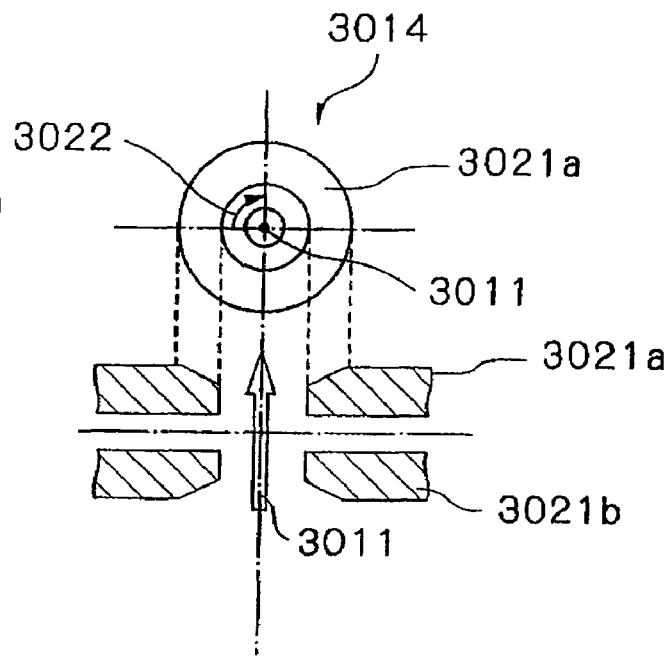
Fig. 13(A)
Fig. 13(B)
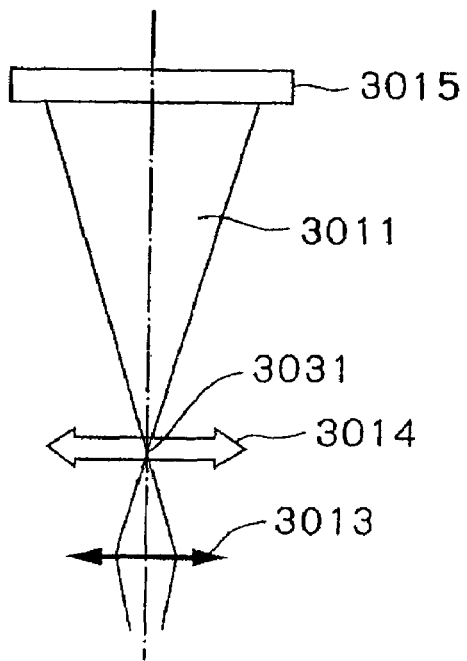
Fig. 14

ELECTRON BEAM INSPECTION SYSTEM AND INSPECTION METHOD AND METHOD OF MANUFACTURING DEVICES USING THE SYSTEM

This application is a divisional of application Ser. No. 11/290,688, filed Dec. 1, 2005, now U.S. Pat. No. 7,351,969 which is a divisional of application Ser. No. 09/985,317, filed Nov. 2, 2001, which is now U.S. Pat. No. 6,992,290, issued Jan. 31, 2006.

BACKGROUND OF THE INVENTION

The present invention relates to an inspection system for inspecting an object, e.g. a wafer, by using an electron beam to detect a defect or the like in a pattern formed on the surface of the sample under inspection.

More particularly, the present invention relates to an inspection system and inspection method wherein an electron beam is irradiated to the surface of an object under inspection, and image data is obtained from the number of secondary electrons emitted from the sample surface, which varies according to the properties of the sample surface, and a pattern or the like formed on the sample surface is inspected with high throughput on the basis of the image data, as in the case of detecting defects on a wafer in the semiconductor fabrication process. The present invention also relates to a method of fabricating devices at high yield by using the inspection system.

Semiconductor fabrication processes are going to enter a new era where design rules are 100 nm. The form of production is shifting from limited large-lot production, represented by the fabrication of DRAMs, to diverse small-lot production as is the case with SOC (Silicon On Chip).

As a result, the number of production steps has increased, and it has become essential to improve the yield for each production step. Consequently, the inspection for process-induced defects has become important. Conventionally, a wafer defect inspection is performed after each step of the semiconductor manufacturing process. With the progress of the technology to fabricate high-integration semiconductor devices and to form small and fine patterns, a high-resolution and high-throughput defect inspection system has been demanded. The reason for this is that a resolution of 100 nm or below is required to detect the defects on a wafer substrate fabricated with 100 nm design rules. In addition, as the degree of integration of semiconductor devices inspections to be performed. For this reason, high throughput is demanded. Further, as the number of layers constituting semiconductor devices increases, it is required that the defect inspection system should have the function of detecting contact failures (electrical defects) of vias for connection between wiring patterns on different layers.

As this type of defect inspection system, an optical defect inspection system has heretofore been used. However, the optical defect inspection system is limited in its resolution capability. That is, the resolution is limited to ½ of the wavelength of light used. In a practical example using visible light, the resolution is of the order of 0.2 μm. Thus, the optical defect inspection system cannot meet the resolution requirements. Further, the optical defect inspection system cannot perform inspection for electrical conduction failures (opens, shorts, etc.), that is, contact failures occurring in semiconductor devices.

Under these circumstances, a defect inspection system using an electron beam has recently been developed for use in place of the optical defect inspection system.

In such an electron beam type defect inspection system, a scanning electron microscope system (SEM system) has generally been put to practical use. The inspection system exhibits a relatively high resolution, i.e. 0.1 μm, and is capable of inspection for electrical defects (disconnection and conduction failures of wiring patterns, conduction failures of vias, etc.). In the defect inspection system making use of SEM, however, the amount of beam current and the response speed of the detector are limited. Therefore, a great deal of time is required to perform defect inspection. For example, it takes 8 hours to inspect one wafer (20-cm wafer). Thus, the inspection time is extremely long. Accordingly, the throughput (the number of wafers inspected per unit time) is unfavorably low in comparison to other process systems such as optical defect inspection systems. In addition, the electron beam type defect inspection system is very costly. Accordingly, it is difficult to use it after each step of the semiconductor fabrication process. In the present state of the art, the electron beam type defect inspection system is used after an important process step, e.g. after etching, film deposition (including copper plating), or CMP (Chemical/Mechanical Polishing) planarization treatment.

The defect inspection system using the scanning electron microscope system (SEM system) will be described below in more detail. In the defect inspection system, an electron beam is focussed (the focussed beam diameter corresponds to the resolution) and a sample, e.g. a wafer is linearly irradiated so as to be scanned with the focussed electron beam. Meanwhile, a stage having the wafer placed thereon is moved in a direction perpendicular to the electron beam scanning direction, whereby an observation region on the wafer is irradiated planarly with the electron beam. The scanning width of the electron beam is generally several 100 μm. By the irradiation with the focussed electron beam (referred to as "primary electron beam"), secondary electrons are emitted from the wafer. The secondary electrons are detected with a detector (a scintillator+a photomultiplier) or a semiconductor type detector (a PIN diode type detector), for example. The coordinates of the position of irradiation with the electron beam and the number of secondary electrons (signal intensity) are combined to produce an image. Image data thus obtained is stored in a storage unit. Alternatively, the image can be output onto a CRT (Cathode-Ray Tube). The foregoing is the principle of the SEM (Scanning Electron Microscope). From the image obtained by this method, possible defects on the in-process semiconductor (Si, in general) wafer are detected. The inspection speed (corresponding to the throughput) is determined by the amount of the primary electron beam (electric current value), the beam diameter, and the response speed of the detector. The present maximum values of these factors are as follows. The beam diameter is 0.1 μm (this may be regarded as equal to resolution). The electric current value is 100 nA. The response speed of the detector is 100 MHz. In this case, it takes about 8 hours to inspect one wafer having a diameter of 20 cm, as has been stated above. Thus, the scanning electron beam type defect inspection system suffers from a serious problem that the inspection speed is extremely lower (1/20 or less) than those of other process systems such as optical defect inspection systems.

The present invention was made in view of the above-described problems. Accordingly, an object of the present invention is to improve the inspection speed for detecting defects on a sample, e.g. a wafer.

SUMMARY OF THE INVENTION

The present invention relates to a defect inspection system utilizing an image projection system using an electron beam as a method for improving the inspection speed of the scanning electron beam (SEM) type defect inspection system. The image projection system will be described below.

In the image projection system, an observation region of a sample is irradiated with a primary electron beam by one shot (i.e. a predetermined area is irradiated with the electron beam without performing scanning), and secondary electrons emitted from the irradiated region are collectively focused onto a detector (a microchannel plate+a fluorescent screen) as an electron beam image by a lens system. The image thus formed is converted into an electric signal by a two-dimensional CCD (Charge-Coupled Device; solid-state image pickup device) or a TDI (Time Delay Integration)-CCD (i.e. a line image sensor) and output onto a CRT or stored in a storage unit as image information. From the image information, possible defects on the sample wafer [in-process semiconductor (Si) wafer] are detected. In the case of CCD, the travel direction of the stage is the minor axis direction (or may be the major axis direction), and the stage is moved in a step-and-repeat manner. In the case of TDI-CCD, the stage is moved continuously in the integration direction. Because it allows images to be obtained continuously, TDI-CCD is used to perform defect inspection continuously. The resolution is determined by the magnification, accuracy and so forth of the image projection optical system (secondary optical system). In a certain experimental example, a resolution of 0.05 µm was obtained. In the experimental example, when the resolution was set to 0.1 µm and electron beam irradiation conditions were set so that the size of an inspection region on a wafer was 200 µm by 50 µm and the amount of the primary electron beam (electric current value) was 1.6 µA, the inspection time was of the order of 1 hour per 20-cm wafer. In other words, the image projection system provides an inspection speed 8 times as high as that obtained by the SEM system. It should be noted that the specifications of TDI-CCD used in the experimental example were as follows. The number of pixels was 2048 pixels×512 rows, and the line rate was 3.3 µs (line frequency: 300 kHz).

The irradiation area (planar dimension) in this example was set in conformity to the specifications of the TDI-CCD. However, the irradiation area may be changed according to the object to be irradiated.

The following is the outline of an electron beam inspection system utilizing the image projection system.

The electron beam inspection system includes a primary electron optical system for shaping an electron beam emitted from an electron gun into a desired configuration (e.g. a rectangular or elliptical configuration) and irradiating the shaped electron beam to the whole area of an observation region on the surface of a sample (e.g. a wafer or a mask; hereinafter occasionally described as a wafer) to be inspected. The electron beam inspection system also includes a secondary electron optical system directs secondary electrons emitted from the wafer toward a detector. The detector converts the secondary electrons into an optical image and forms an image of the wafer. The electron beam inspection system further includes a controller for controlling the detector. The primary electron optical system has an electron gun for emitting an electron beam, and a primary electrostatic lens system for shaping the electron beam into a beam having a predetermined sectional configuration. The primary electron optical system is disposed at a predetermined angle to a direction perpendicular to the surface of the wafer. The constituent elements of the primary electron optical system are placed in series with the electron gun positioned at the top. Between the primary electron optical system and the secondary electron optical system, an E×B deflector (also known as "Wien filter" or "E×B separator") is disposed along a direction perpendicular to the surface of the wafer to deflect the electron beam and to separate the secondary electrons from the wafer by a field where an electric field and a magnetic field perpendicularly intersect each other. The secondary electron optical system has a secondary electrostatic lens system disposed to extend in a direction perpendicular to the wafer surface along the optical axis of the secondary electrons from the wafer, which are separated by the E×B separator, from the primary electron optical axis to deflect and focus the secondary electrons.

As the electron gun, a thermal electron beam source type is used, in which electrons are emitted by heating an emissive material (cathode). Lanthanum hexaboride ($LaB_6$) is used as the emissive material (emitter) as a cathode. It is also possible to use other materials, provided that they have a high melting point (the vapor pressure at high temperatures is low) and a low work function. A cathode of lanthanum hexaboride ($LaB_6$) having a truncated conical tip is used. It is also possible to use a frustoconical cathode, i.e. a truncated cone-shaped cathode. The diameter of the truncated tip of the cathode is of the order of 100 µm. There are other electron beam sources available, i.e. a field emission type electron beam source and a thermal field emission type electron beam source. However, a thermal electron beam source using $LaB_6$ is most suitable for use in a system in which a relatively wide region (e.g. 100 by 25 to 400 by 100 µm$^2$) is irradiated with a large electric current (of the order of 1 µA) as in the case of the present invention. It should be noted that the SEM system generally uses a thermal field emission type electron beam source. It is a matter of course that a field emission type electron beam source or a thermal field emission type electron beam source may be used in this embodiment in place of thermal electron beam source. The thermal field emission type electron beam source is a system in which electrons are emitted by applying a high electric field to an emissive material, and the emission of electrons is stabilized by heating its electron beam emitting part.

The primary electron optical system constitutes a part that forms a primary electron beam emitted from an electron gun and shapes the primary electron beam into a desired configuration, e.g. a rectangular or circular (elliptical) configuration, and further irradiates the rectangular or circular (elliptical) primary electron beam to the wafer surface. The beam size and current density of the primary electron beam can be controlled by controlling the conditions of lenses provided in the primary electron optical system. The E×B filter (Wien filter) provided at the joint between the primary and secondary electron optical systems can change the course of the primary electron beam so that it is incident perpendicularly or normally on the wafer surface.

The electron gun is further provided with a Wehnelt, triple anode lens and a gun aperture. Thermal electron emitted from the cathode formed from $LaB_6$ are focused through the Wehnelt and triple anode lens onto the gun aperture as a crossover image.

The primary electron optical system is further provided with a field aperture for optimizing the area of the primary electron beam on the wafer, together with an NA aperture. The primary electron beam whose angle of incidence on the lens has been optimized by the field aperture is focussed by the primary electrostatic lens system to form a light crossover image at the NA aperture before being planarly irradiated to the wafer surface. The second stage of the primary system electrostatic lens comprises quadrupole lenses (QL) arranged in three stages and one aperture aberration correcting electrode. Quadrupole lenses require strict alignment accuracy but exhibit strong focussing action in comparison to rotationally symmetric lenses. The aberration of the quadrupole lenses, which correspond to the spherical aberration of rotationally symmetric lenses, can be corrected by applying an appropriate voltage to the aperture aberration correcting electrode. Thus, a uniform planar beam can be applied to a predetermined region on the wafer surface.

The secondary electron optical system has an electrostatic lens (CL) and an intermediate lens (TL), which correspond to an projector, a field aperture (FA), and a second-stage lens (PL) provided on the detector side of the field aperture position. Thus, a two-dimensional secondary electron image generated by the electron beam applied to the wafer surface is formed at the field aperture position by the electrostatic lens (CL) and the intermediate lens (TL), which correspond to an projector, and projected as a magnified image by the projection lens (PL). This image-forming optical system is called "secondary electron optical system".

It is preferable that a minus bias voltage (decelerating field voltage) should be applied to the wafer. The decelerating electric field has the effect of decelerating the incident (irradiation) beam, which minimizes the damage to the sample. In addition, the decelerating electric field accelerates secondary electrons emitted from the sample surface by the electric potential difference between the electrostatic lens (CL) and the wafer, thereby effectively reducing chromatic aberration. The electrons converged by the electrostatic lens (CL) are focused through the intermediate lens (TL) to form a secondary electron image at the field aperture (FA). The image is projected as a magnified image on the microchannel plate (MCP) through the projection lens (PL). In this optical system, a numerical aperture NA is provided between the electrostatic lens CL and the intermediate lens TL. The numerical aperture NA is optimized to form an optical system capable of minimizing off-axis aberrations.

Further, an electrostatic octapole stigmator (STIG) is provided to correct errors in the manufacture of the electron optical systems and the astigmatism and anisotropic aberration of magnification introduced into the image by passing through the E×B filter (Wien filter). Misalignment is corrected by using a deflector (OP) disposed between each pair of adjacent lenses. Thus, it is possible to attain an image projection optical system providing a uniform resolution in the field of view.

The E×B deflector is a unit of an electromagnetic prism optical system in which electrodes and magnetic poles are disposed in orthogonal directions so that an electric field and a magnetic field intersect each other at right angles. The E×B deflector can produce conditions (Wien conditions) under which when an electromagnetic field is selectively applied to the field, an electron beam entering the field from one direction is deflected, whereas an electron beam entering the field from the opposite direction is allowed to travel straight owing to the fact that the influence of force applied to the electron beam from the electric field and the influence of force applied thereto from the magnetic field cancel each other. Thus, the primary electron beam is deflected to be irradiated perpendicularly or normally to the wafer surface, while the secondary electron beam is allowed to travel straight toward the detector.

The secondary electron image from the wafer formed by the secondary electron optical system is first amplified by the microchannel plate (MCP) and then converted into a light image through the fluorescent screen. The principle of the MCP is as follows. A bundle of several millions of extremely short electrically conductive glass capillaries having a diameter of 6 to 25 μm and a length of 0.24 to 1.0 mm is shaped into a thin plate. When a predetermined voltage is applied to the plate, each capillary operates as an independent secondary electron multiplier. Thus, the microchannel plate forms a secondary electron amplifier as a whole.

The light image produced through conversion by the fluorescent screen is projected onto the TDI-CCD as a 1× magnified image by a relay optical system placed in the atmospheric air through a vacuum transmission window or by a relay optical system also serving as a vacuum feedthrough optical system.

BRIEF DESCRIPTION OF THE DRAWINGS

FIGS. 13(A) and 13(B) are diagrams illustrating the operating principle of a magnetic lens shown in FIG. 12.

FIG. 14 is a diagram showing an example of placement of the magnetic lens shown in FIG. 12.

DETAILED DESCRIPTION OF THE PREFERRED EMBODIMENTS

An image projection type electron beam inspection system according to an embodiment of the present invention will be described below specifically to clarify the relationship between the principal functions of the image projection system and the overall structure thereof.

Figure 1:
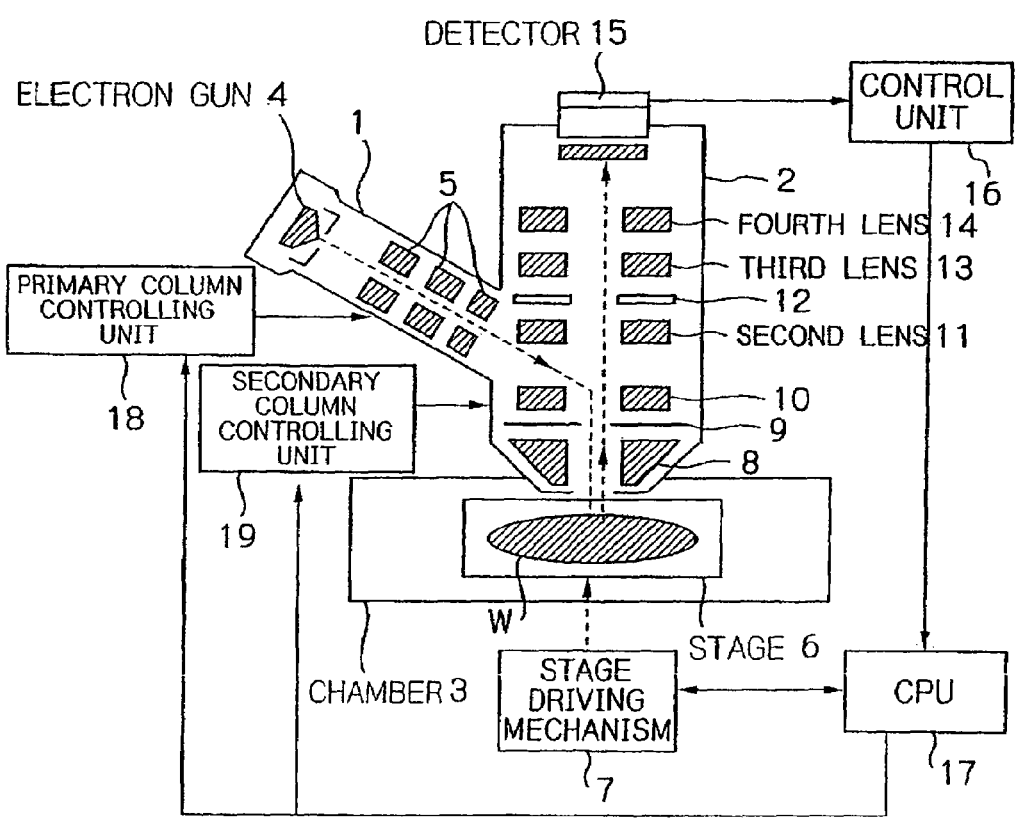
FIG. 1 is a diagram showing the general arrangement of an image projection type electron beam inspection system according to an embodiment of the present invention.

FIG. 1 is a general view of the image projection type electron beam inspection system according to this embodiment. It should be noted, however, that part of the arrangement is omitted in the illustration.

In FIG. 1, the electron beam inspection system has a primary column 1, a secondary column 2, and a chamber 3. An electron gun 4 is provided in the primary column 1. A primary optical system 5 is disposed on the optical axis of an electron beam (primary beam) emitted from the electron gun 4. A stage 6 is installed in the chamber 3. A sample W is placed on the stage 6.

Meanwhile, the secondary column 2 contains a cathode lens 8, a numerical aperture 9, a Wien filter 10, a second lens 11, a field aperture 12, a third lens 13, a fourth lens 14, and a detector 15, which are disposed on the optical axis of a secondary beam generated from the sample W. It should be noted that the numerical aperture 9 corresponds to an aperture stop, which is a thin plate of a metal (e.g. Mo) with a circular hole. The numerical aperture 9 is disposed so that the aperture portion thereof is coincident with the position where the primary beam is focused and also coincident with the focus position of the cathode lens 8. Accordingly, the cathode lens 8 and the numerical aperture 29 constitute a telecentric electron optical system.

Meanwhile, the output of the detector 15 is input to a control unit 16. The output of the control unit 16 is input to a CPU 17. Control signals from the CPU 17 are input to a primary column controlling unit 18, a secondary column controlling unit 19 and a stage driving mechanism 7. The primary column controlling unit 18 controls the voltage applied to the lenses of the primary optical system 5. The secondary column controlling unit 19 controls the voltage applied to each of the cathode lens 8 and the second to fourth lenses 11 to 14 and also controls the electromagnetic field applied to the Wien filter 10.

The stage driving mechanism 7 transmits stage position information to the CPU 17. The primary column 18, the secondary column 19 and the chamber 3 are connected to an evacuation system (not shown) and evacuated by a turbo molecular pump or the like of the evacuation system so that the inside of each of them is kept under vacuum conditions.

The primary beam from the electron gun 4 enters the Wien filter 10 while being subjected to the lens action of the primary optical system 5. In this embodiment, the tip of the electron gun 4 is a rectangular cathode formed from $LaB_6$, which allows a large electric current to be obtained.

The primary optical system 5 uses rotationally asymmetric quadrupole or octopole electrostatic (or electromagnetic) lenses, which can cause convergence and divergence along each of the X- and Y-axes. Such lenses are arranged in two or three stages. By optimizing the conditions of each lens, the beam irradiation region on the sample surface can be shaped into any desired rectangular or elliptical configuration without loss of the incident electrons.

More specifically, when an electrostatic lens is used, four columnar rods (quadrupole) are used. Mutually opposing electrodes are placed in an equipotential state and given voltage characteristics opposite to each other.

It should be noted that the quadrupole lens is not necessarily limited to the column-shaped lens but may be a lens having a configuration defined by dividing a circular plate into four parts, which is generally used in an electrostatic deflector. In this case, it is possible to reduce the size of the lens. The primary beam passing through the primary optical system 5 is bent by the deflecting action of the Wien filter 10. The Wien filter 10 has a magnetic field and an electric field arranged to intersect each other at right angles and allows only charged particles satisfying the Wien condition E=vB to travel straight. In the Wien condition E=vB, E is the electric field, B is the magnetic field, and v is the velocity of the charged particles. The Wien filter 10 bends the path of the other charged particles. For the primary beam, force FB due to the magnetic field and force FE due to the electric field act to bend the beam path. For the secondary beam, the force FB and the force FE act in the opposite directions and hence cancel each other. Accordingly, the secondary beam travels straight as it is.

The lens voltage for the primary optical system 5 is preset so that a electron beam crossover is focussed at the aperture portion of the numerical aperture 9. In other words, Koehler illumination used in optical microscopes is realized. The numerical aperture 9 eliminates an electron beam undesirably scattered in the system from reaching the sample surface, thereby preventing charge-up and contamination of the sample W. When the primary beam is irradiated to the sample W, secondary electrons, reflected electrons or back-scattered electrons are emitted as a secondary beam from the beam-irradiated surface of the sample W.

The secondary beam passes through the cathode lens 8 while being subjected to the lens action thereof.

Incidentally, the cathode lens 8 comprises three electrodes. The lowermost electrode is designed to form a positive electric field with respect to the sample W so that the secondary electrons are efficiently drawn into the cathode lens 8.

The lens action is produced by applying a voltage to the first and second electrodes of the cathode lens 8 and placing the third electrode at zero potential. Meanwhile, the numerical aperture 9 is placed at the focus position of the cathode lens 8, that is, at the back focus position from the sample W. Accordingly, a beam of electrons emitted from positions off the field center (i.e. off-axis points) is also formed into a parallel beam and passes through the center of the numerical aperture 9 without being eclipsed.

It should be noted that the numerical aperture 9 also serves to suppress lens aberrations introduced into the secondary beam from the second to fourth lenses 11 to 14. The secondary beam passing through the numerical aperture 9 travels straight through the Wien filter 10 without being subjected to the deflecting action of the Wien filter 10.

If the secondary beam is focused to form an image by the cathode lens 8 alone, chromatic aberration of magnification and distortion are likely to occur. Therefore, the cathode lens 8 is combined with the second lens 11 to perform first image formation. The secondary beam forms an intermediate image at the field aperture 12 through the cathode lens 8 and the second lens 11. In this case, it is generally likely that the magnifying power necessary for the secondary optical system will become insufficient. Therefore, the third lens 13 and the fourth lens 14 are added to magnify the intermediate image. The third and fourth lenses 13 and 14 are arranged so that a magnifying image-forming operation takes place when the secondary beam passes through each of the third and fourth lenses 13 and 14. That is, a total of three image-forming operations take place in this optical system. It should be noted that the third lens 13 and the fourth lens 14 may be arranged to perform one image-forming operation in combination (i.e. a total of two image-forming operations take place in the optical system).

The second to fourth lenses 11 to 14 are all rotationally symmetric lenses (or lenses symmetric with respect to the optical axis) known as "unipotential lenses" or "Einzel lenses".

Each lens comprises three electrodes. Normally, two outer electrodes are placed at zero potential, and a voltage is applied to the central electrode to effect lens action under control. The field aperture 12 is disposed at a point where the intermediate image is formed. The field aperture 12 limits the visual field to a necessary range as in the case of the field stop of an optical microscope. The field aperture 12 also serves to eliminate an unnecessary electron beam in cooperation with the third lens 13 and the fourth lens 14 provided in the subsequent stage, thereby preventing the generation of noise in the detector 15 and contamination thereof. It should be noted that the magnifying factor is set by varying the lens conditions (focal length) of the third and fourth lenses 13 and 14.

The secondary beam is projected by the secondary optical system to form a magnified image on the detecting surface of the detector 15. The detector 15 includes a microchannel plate (MCP) for multiplying electrons and a fluorescent screen for converting the electrons into light. The detector 15 further includes a lens and other optical system for relaying and transmitting the optical image from the vacuum system to the outside, together with an image pickup device (e.g. a CCD). The secondary beam is focused onto the MCP detecting surface and multiplied by the MCP. The multiplied electrons are converted into a light signal by the fluorescent screen and then converted into a photoelectric signal by the image pickup device.

The control unit 16 reads the sample image signal from the detector 15 and transmits it to the CPU 17. The CPU 17 inspects the pattern on the sample W for defects on the basis of the image signal by template matching or the like. The stage 6 is movable in the X- and Y-directions by the stage driving mechanism 7. The CPU 17 reads the position of the stage 6 and outputs a drive control signal to the stage driving mechanism 7 to drive the stage 6, thereby sequentially performing the detection and inspection of the image are carried out.

Regarding the secondary beam, all the principal rays from the sample W are incident perpendicularly or normally on the cathode lens 8 (i.e. in parallel to the optical axis of the lens 8) to pass through the numerical aperture 9. Therefore, marginal rays of light are not eclipsed. Hence, there is no reduction in the image luminance at the peripheral portion of the sample W. Usually, variations in the electron energy cause the image formation position to differ. That is, chromatic aberration of magnification (chromatic difference of magnification) occurs (in particular, the secondary electrons suffer large chromatic aberration of magnification because of large variations in energy). However, the chromatic aberration of magnification can be suppressed by placing the numerical aperture 9 at the focus position of the cathode lens 8.

Because the change of the magnifying power is made after the secondary electrons have passed through the numerical aperture 9, even if the magnifications of the third and fourth lenses 13 and 14, which have been set as lens conditions, are varied, it is possible to obtain a uniform image over the whole field of view on the detector side. Although a variation-free, uniform image can obtained in this embodiment, when the magnifying factor is raised, usually, the brightness of the image lowers unfavorably. To solve this problem, the lens conditions of the primary optical system are set so that when the magnifying factor is changed by varying the lens conditions of the secondary optical system, the effective visual field on the sample surface, which is determined by the magnifying power, and the electron beam irradiated to the sample surface have the same size.

More specifically, as the magnification is raised, the visual field becomes narrower. However, if the electron beam irradiation energy density is increased at the same time as the magnification is raised, the detected electron signal density is kept constant at all times even if the secondary electrons are projected as a magnified image by the secondary optical system. Thus, the brightness of the image will not lower.

Although the electron beam inspection system in this embodiment uses the Wien filter 10 that bends the path of the primary beam but allows the secondary beam to travel straight, the present invention is not necessarily limited to the described arrangement. The electron beam inspection system may use a Wien filter that allows the primary beam to travel straight but bends the path of the secondary beam. Further, in the foregoing embodiment, a rectangular beam is formed by using a rectangular cathode and a quadrupole lens system. However, the present invention is not necessarily limited to the described arrangement. For example, a rectangular beam or an elliptical beam may be produced from a circular beam. Alternatively, a rectangular beam may be formed by passing a circular beam through a slit.

Figure 2:
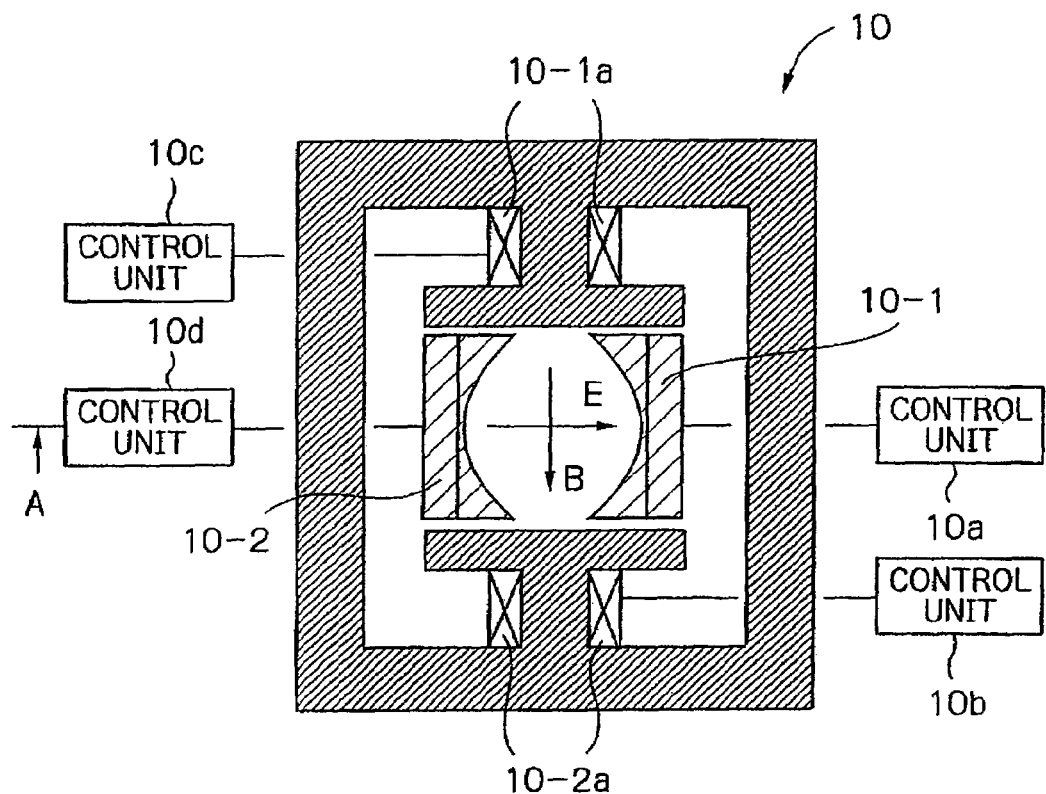
FIG. 2 is a horizontal sectional view showing the detailed arrangement of an E×B deflector (i.e. an electron beam separator) in the electron beam inspection system.
Figure 3:
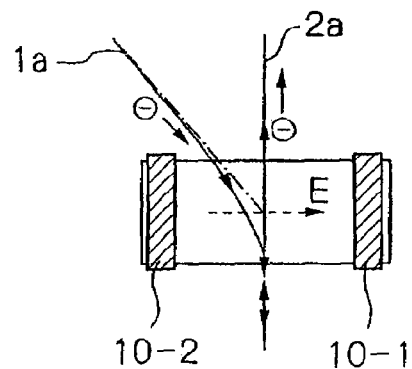
FIG. 3 is a sectional view showing a vertical sectional structure taken along the line A-A in FIG. 2.

The structure of the electron beam deflector 10 operating as a Wien filter, i.e. an E×B deflector, will be described below in detail with reference to FIG. 2 and FIG. 3, which shows a vertical section taken along the line A-A in FIG. 2. As shown in FIG. 2, the field of the electron beam deflector 10 has a structure in which an electric field and a magnetic field are placed to intersect each other at right angles in a plane perpendicular to the optical axis of an image projection optical part (i.e. a part in which a one- or two-dimensional image of secondary electrons and reflected electrons emitted according to the conditions of the sample surface when an electron beam is applied to the sample is formed on the electron beam detector). That is, the electron beam deflector 10 has an E×B structure.

In the electron beam deflector 10, the electric field is generated by electrodes 10-1 and 10-2 each having a concavely curved surface. The electric field generated by the electrodes 10-1 and 10-2 is controlled by control units 10a and 10d. Meanwhile, electromagnetic coils 10-1a and 10-2 a are disposed to face each other in a direction perpendicular to the direction in which the electric field-generating electrodes 10-1 and 10-2 face each other, thereby generating a magnetic field. It should be noted that the electric field-generating electrodes 10-1 and 10-2 are in point symmetry (the electrodes 10-1 and 102 may be in concentric relation to each other).

In this case, in order to improve the uniformity of the magnetic field, pole pieces having a plane-parallel plate configuration are provided to form a magnetic path. The behavior of the electron beam in the vertical section taken along the line A-A is as shown in FIG. 3. The incident electron beam 1a is deflected by the electric field generated by the electrodes 10-1 and 10-2 and the magnetic field generated by the electromagnetic coils 10-1a and 10-2 a. Thereafter, the electron beam 1a is incident on the sample surface in a direction perpendicular thereto.

The position through which the incident electron beam 1a enters the electron beam deflector 10 and the incident angle of the electron beam 1a are uniquely determined when the electron energy is determined. Further, the electric field generated by the electrodes 10-1 and 10-2 and the magnetic field generated by the electromagnetic coils 10-1a and 10-2 a are controlled by the control units 10a and 10d and the control units 10c and 10b, respectively, so as to satisfy the condition for the electric and magnetic fields, i.e. vB=E, so that secondary electrons 2a travel straight. Consequently, the secondary electrons 2a travel straight through the electron beam deflector 10 to enter the image projection optical part. In the above condition vB=E, v is the velocity (m/s) of the electrons 2a, B is the magnetic field (T), and E is the electric field (V/m).

Next, another embodiment of the defect inspection system utilizing the image projection system will be described.

The defect inspection system utilizing the image projection system involves the following problems: ☐ because an electron beam is applied to the whole observation region of the sample surface by one shot, charge-up is likely to occur on the sample surface; and ☐ there is a limit to the electron beam current obtained by this system (about 1.6 µA), which is an obstacle to improvement in the inspection speed.

In this embodiment, a plurality of primary electron beams are used, and the primary electron beams are applied to an observation region on the sample surface while the observation region is scanned with the primary electron beams two-dimensionally (X- and Y-directions; i.e. while performing raster scanning). Further, the image projection system is adopted for the secondary electron optical system. With this arrangement, the above-described problems can be solved. The defect inspection system according to this embodiment has the above-described advantages of the image projection system. In addition, scanning with a plurality of primary electron beams makes it possible to solve the problems of the image projection system: ☐ because an electron beam is applied to the whole observation region of the sample surface by one shot, charge-up is likely to occur on the sample surface; and ☐ there is a limit to the electron beam current obtained by this system (about 1.6 µA), which is an obstacle to improvement in the inspection speed. That is, because the electron beam irradiation point moves, it is easy for the electric charge to escape. Consequently, charge-up reduces. The required electric current value can be readily increased by increasing the number of electron beams used. In this embodiment, when four primary electron beams are used, for example, if the electric current of one electron beam is 500 nA (electron beam diameter: 10 µm), an electric current of 2 µA is obtained in total.

The number of primary electron beams can readily be increased to about 16 electron beams. In this case, 8 µA can be obtained in theory. To scan a sample with a plurality of primary electron beams, not only the above-described raster scanning but also other types of scanning, e.g. Lissajous's figure scanning, can be used as long as the plurality of primary electron beams can be applied so that the amount of irradiation with the electron beams is uniform throughout the irradiated region. Accordingly, the directing direction of the stage for scanning is not necessarily limited to the direction perpendicular to the directing direction of the plurality of electron beams for scanning.

As an electron beam source in this embodiment, it is possible to use a thermal electron beam source (in which electrons are emitted by heating an emissive material). In this case also, it is preferable to use $LaB_6$ as an emissive (emitter) material. Other materials are also usable, provided that they have a high melting point (the vapor pressure at high temperatures is low) and a low work function. To obtain a plurality of electron beams, two methods are available. One is a method wherein a single electron beam is obtained from a single emitter (with a single projection) and passed through a thin plate (aperture plate) provided with a plurality of holes, thereby obtaining a plurality of primary electron beams. The other is a method wherein a plurality of primary electron beams are drawn out directly from a plurality of tips formed on a single cathode material. Either of the methods makes use of the property of the electron beam that it is readily emitted from the tip of a projection. It is also possible to use other types of electron beam sources, e.g. a thermal electric field emission type electron beam source. The thermal electric field emission type electron beam source is a system in which electrons are emitted by applying a high electric field to an emissive material, and the emission of electrons is stabilized by heating its electron beam emitting part.

Next, the above-described embodiment, in which a plurality of primary electron beams are irradiated to an observation region on the sample surface while the region is scanned with the electron beam two-dimensionally (X- and Y-directions;

i.e. while performing raster-scanning), and the image projection system is adopted for the secondary electron optical system, will be described in more detail with reference to FIGS. 4 and 5.

In the following embodiment, a method wherein a plurality of primary electron beams are drawn out directly from a plurality of tips formed on a single emitter is adopted as a method of obtaining a plurality of primary electron beams.

Figure 4:
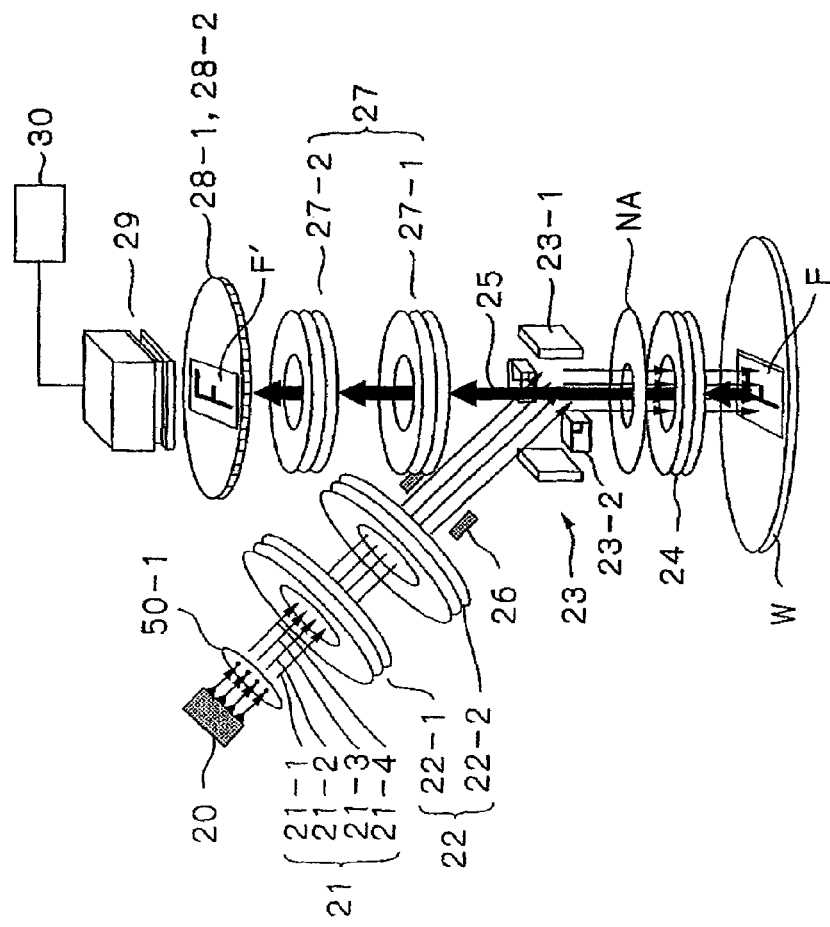
FIG. 4 is a diagram showing the general arrangement of an image projection type electron beam inspection system designed to apply a plurality of primary electron beams to an observation region of a sample surface while the region being two-dimensionally scanned with the electron beams.

As shown in FIG. 4, four electron beams 21 (21-1, 21-2, 21-3 and 21-4) emitted from an electron gun 20 are shaped by an aperture 50-1 and passed through lenses 22-1 and 22-2 arranged in two stages to form an elliptical image having a size of 10 µm by 12 µm on the deflection center plane of a Wien filter 23. Raster-scanning is performed by a deflector 26 in a direction perpendicular to the plane of the figure so that the four electron beams is formed into an image so as to uniformly cover a rectangular region of 1 mm by 0.25 mm as a whole. The electron beams deflected by the E×B deflector 23 serving as a Wien filter form a crossover at the numerical aperture NA. The beams thus formed are reduced to ⅕ by a lens 24 and projected onto the surface of a sample W so as to cover a region of 200 µm by 50 µm and be applied perpendicularly or normally to the sample surface. Consequently, four secondary electron beams 25 carrying pattern image (sample image F) information are emitted from the sample W. The electron beams 25 are magnified through the lenses 24, 27-1 and 27-2 and focused onto an MCP 28-1 as a rectangular image (magnified projected image F') composed of the four electron beams 25. The magnified projected image F' formed from the secondary electron beams 25 is intensified 10,000 times by the MCP 28-1 and converted into light by a fluorescent part 28-2. The light thus obtained is converted into an electric signal synchronized with the continuously moving speed of the sample W by a TDI (Time Delay Integration)-CCD 29. The electric signal is acquired as a continuous image by an image display unit 30 and output onto a CRT or the like.

The electron beam irradiation unit needs to irradiate the sample surface with the electron beam in a rectangular configuration as uniformly as possible and with minimized variations of irradiation. In order to increase throughput, it is necessary to apply the electron beam to the region to be irradiated with an increased electric current. Conventional systems suffer electron beam irradiation variations of the order of ±10% and hence large image contrast variations.

Further, in the conventional systems, the electron beam current is as small as about 500 nA at the irradiated region. Therefore, high throughput cannot be obtained. In addition, because in this type of system a wide image observation region is entirely irradiated with an electron beam by one shot, an imaging trouble due to charge-up is more likely to occur than in the case of the scanning electron microscope (SEM) system.

Figure 5:
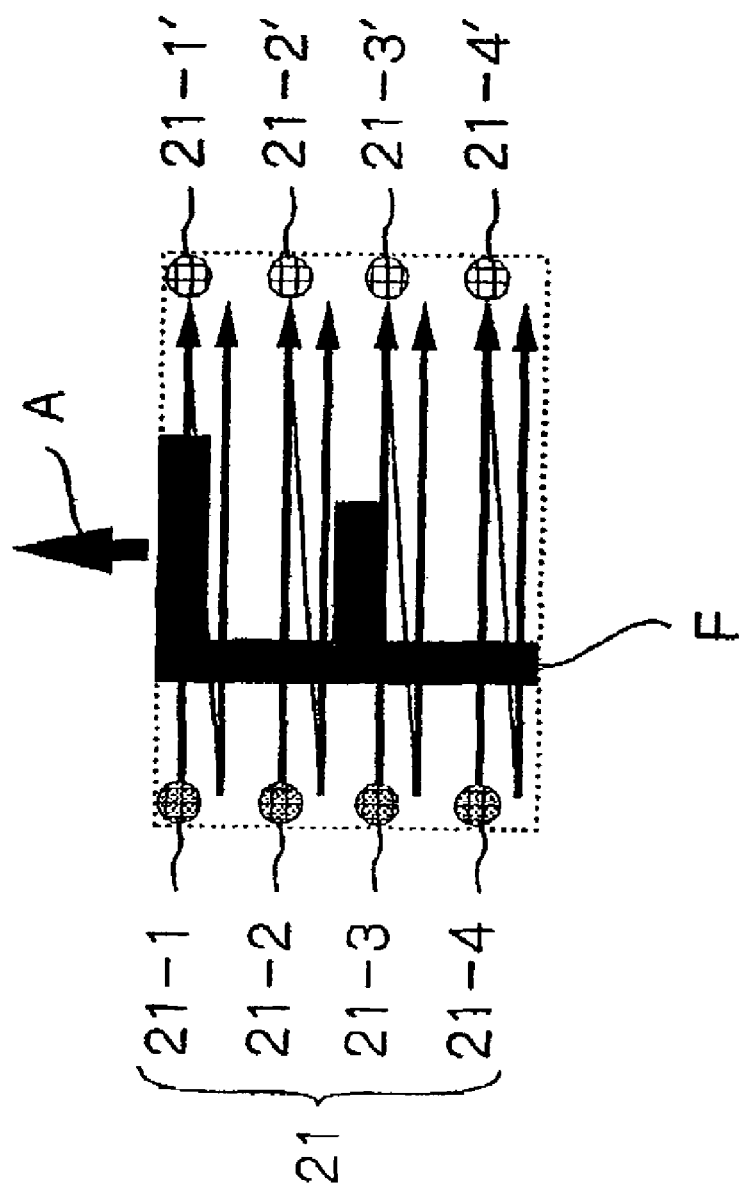
FIG. 5 is a diagram for describing a method of irradiating primary electron beams in the system shown in FIG. 4.

The primary electron beam irradiation method according to this embodiment is shown in FIG. 5. The combination of electron beams 21 consists of four electron beams 21-1, 21-2, 21-3 and 21-4. Each beam has an elliptical sectional configuration with a size of 2 µm by 2.4 µm and a rectangular region of 200 µm by 12.5 µm is raster-scanned with each beam in such a manner that the raster-scanned regions do not overlap each other. Thus, a rectangular region of 200 µm by 50 µm as a whole is irradiated with the four electron beams 21-1, 21-2, 21-3 and 21-4. The beam at a point 21-1 arrives at 21-1' in a finite time and then returns to a point directly below 21-1 (toward 21-2), which is away from 21-1 by a distance corresponding to the beam spot diameter (10 µm), with substantially no loss of time. Then, the beam moves parallel to the path 21-1 to 21-1', to a point directly below 21-1' (toward 21-2') again in the same finite time as the above. This is repeated to scan ¼ (200 µm by 12.5 µm) of the rectangular irradiation region indicated by the dotted line in the figure. Thereafter, the beam returns to the starting point 21-1. This operation is repeated at high speed. The other electron beams 21-2 to 21-4 repeatedly are directed for scanning in the same way and at the same speed as the electron beam 21-1, thereby uniformly speedily irradiating the rectangular irradiation region (200 µm by 50 µm) shown in the figure as a whole. The scanning method is not necessarily limited to the above-described raster scan but may be other types of scanning, provided that the irradiation region can be irradiated uniformly. For example, the beam scan may be performed in such a manner as to draw a Lissajous's figure. Therefore, the stage moving direction is not necessarily limited to the direction A shown in the figure. That is, the stage moving direction does not always need to be perpendicular to the scanning direction (the high-speed scanning direction, i.e. the horizontal direction in the figure). According to this embodiment, electron beam irradiation variations were favorably reduced to about ±3%. The irradiation electric current was 250 nA per electron beam. At the sample surface, the four electron beams provided 1.0 µA as a whole (double the value obtained with the conventional system). Thus, an increase in the number of electron beams applied makes it possible to increase the electric current and to obtain increased throughput. In addition, the irradiation point is smaller than in the conventional system (about 1/80 in terms of area) and moving. Therefore, it was possible to suppress charge-up to 1/20 or less of that in the conventional system.

Although not shown in the figure, the system according to this embodiment has, in addition to the lenses, a limiting field aperture (selector aperture), a deflector (aligner) having four or more electrode for alignment of electron beams, an astigmatism corrector (stigmator), and units necessary for electron beam illumination and image formation, such as a plurality of quadrupole lenses (four-pole lenses) for shaping the beams.

Next, another embodiment of the image projection type electron beam inspection system will be described. The electron beam inspection system according to this embodiment is designed so that defect inspection of a sample (e.g. a wafer or a mask), particularly a wafer having a device pattern with a minimum line width of 0.1 µm or less, can be performed with high throughput and high reliability.

First, the outline of this embodiment will be described.

The image projection type electron beam inspection system according to this embodiment shapes an electron beam emitted from an electron gun into a rectangular electron beam, applies the electron beam to the surface of a wafer, and directs secondary electrons emitted from the wafer surface toward a detector to form a secondary electron image. Such an image projection type electron beam inspection system for defect inspection uses a rectangular or planar beam having a diameter larger than the beam spot diameter in scanning electron microscopes, and images the whole irradiated region by one shot to acquire an image thereof. Accordingly, the image projection type electron beam inspection system can provide higher throughput than in the case of the scanning type. Thus, it is possible to meet the demand for higher throughput. Further, with this system, the whole wafer surface is scanned with an electron beam by moving the stage continuously. Secondary electrons emitted from the wafer as a result of the scanning are converted into an optical image through a fluorescent screen, and the image thus obtained is detected with a line sensor (TDI-CCD).

Figure 9:
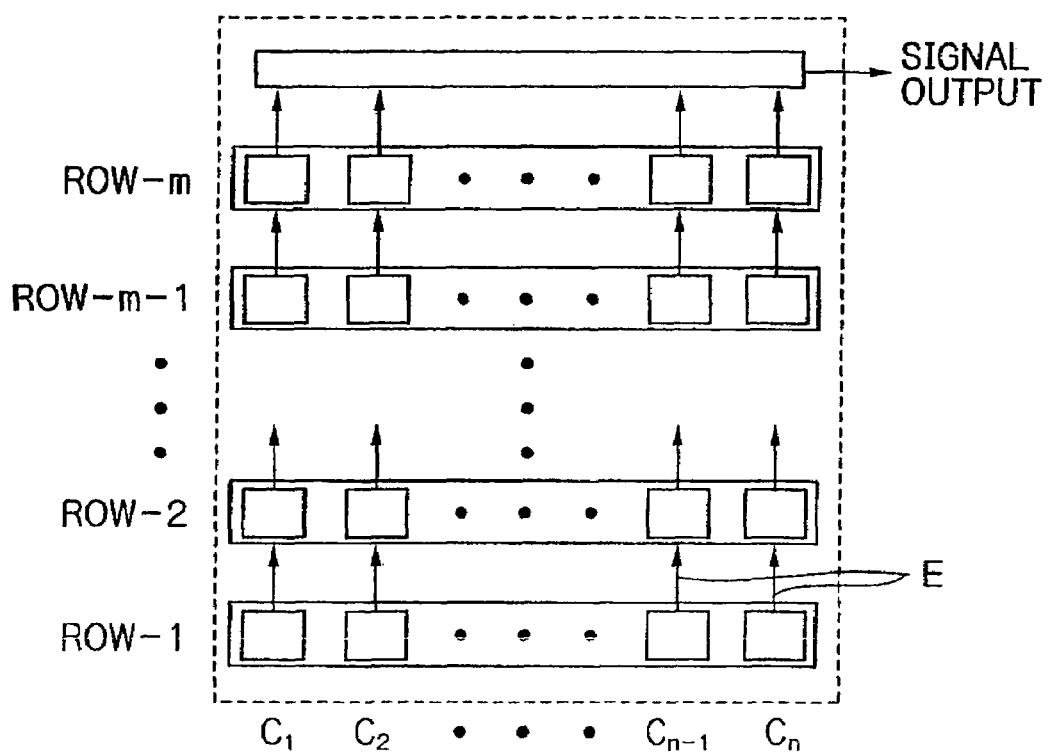
FIG. 9 is a diagram showing the array of pixels of a line sensor.

In such a line sensor, as shown in FIG. 9, n CCD pixels $C_1$ to $C_n$ are arranged in a line in the direction (horizontal direction in the figure) of one of two orthogonal axes to form one CCD pixel row, and m CCD pixel rows ROW-1 to ROW-m are arranged in the other axis direction (vertical direction in the figure) to form a CCD array. Electric charges accumulated in each CCD pixel row are transferred simultaneously in the vertical direction by a distance corresponding to one CCD pixel in response to one vertical clock signal given externally (i.e. the electric charges move in the direction of the arrows E). A line image of n pixels picked up in ROW-1 at a certain time is transferred to ROW-2 when a clock signal is given. When a subsequent clock signal is given, the line image transferred to ROW-2 further moves vertically by a distance corresponding to one pixel, thereby being transferred to ROW-3. In this way, charge transfer is repeatedly performed up to ROW-m as the image moves. Finally, the electric charges are taken out of the line sensor from a horizontal output register as image data.

However, if the charge transfer time (hereinafter referred to as "line rate") of the lines sensor is kept constant during the imaging operation, image blur may be caused by asynchronous charge transfer in the line sensor owing to variations in the stage moving speed, which gives rise to no problem in the defect inspection system utilizing the scanning electron microscope system. In addition, when there is a change in the magnification of the electron optical system caused by the focusing mechanism due to the inspection of the whole surface of the wafer, the pixel size on the wafer changes. This causes the optimum line rate to vary, resulting in image blur similar to the above.

An object of this embodiment is to provide an electron beam inspection system for defect inspection that is capable of avoiding image blur as caused by asynchronous charge transfer by making the line rate of the line sensor synchronous with the stage moving speed at all times.

Another object of this embodiment is to provide an electron beam inspection system for defect inspection that is capable of avoiding image blur as caused by a change in the magnification of the electron optical system.

Accordingly, the image projection type electron beam inspection system for defect inspection according to this embodiment has a primary electron optical system for shaping an electron beam emitted from an electron gun into a desired configuration and for irradiating the shaped electron beam to a surface of a sample to be inspected. A secondary electron optical system forms an image of secondary electrons emitted from the sample. A detector converts the formed secondary electron image into an optical image through a fluorescent screen and detects the optical image with a line sensor. The electron beam inspection system is provided with a controller whereby the charge transfer time at which a picked-up line image is transferred between each pair of adjacent pixel rows provided in the line sensor is controlled in association with the moving speed of a stage for moving the sample. The stage moving speed is detected, and an optimum line rate is calculated and fed back, whereby the line rate of the line sensor is synchronized with the stage moving speed at all times. Thus, image blur as caused by asynchronous charge transfer can be avoided.

In a modification of the electron beam inspection system according to this embodiment, the charge transfer time of the line sensor is controlled in association with a change of the magnification of the primary and secondary electron optical systems. Thus, even when there is a change in the magnification of the electron optical systems caused by the focusing mechanism due to the inspection of the whole surface of the wafer, image blur as caused by asynchronous charge transfer can be avoided.

In another modification, a microchannel plate is placed in the stage preceding the fluorescent screen to multiply the secondary electrons in the secondary electron optical system.

In another modification, the electron beam inspection system has a laser interferometer for measuring the position of the stage. Thus, stage position information can be detected from the laser interferometer, and an optimum line rate can be calculated from the stage moving speed and fed back. Accordingly, it is possible to synchronize the line rate of the line sensor with the stage moving speed at all times and hence possible to avoid image blur as caused by asynchronous charge transfer.

The image projection type electron beam inspection system for defect inspection according to this embodiment will be described below more specifically with reference to the accompanying drawings.

Figure 6:
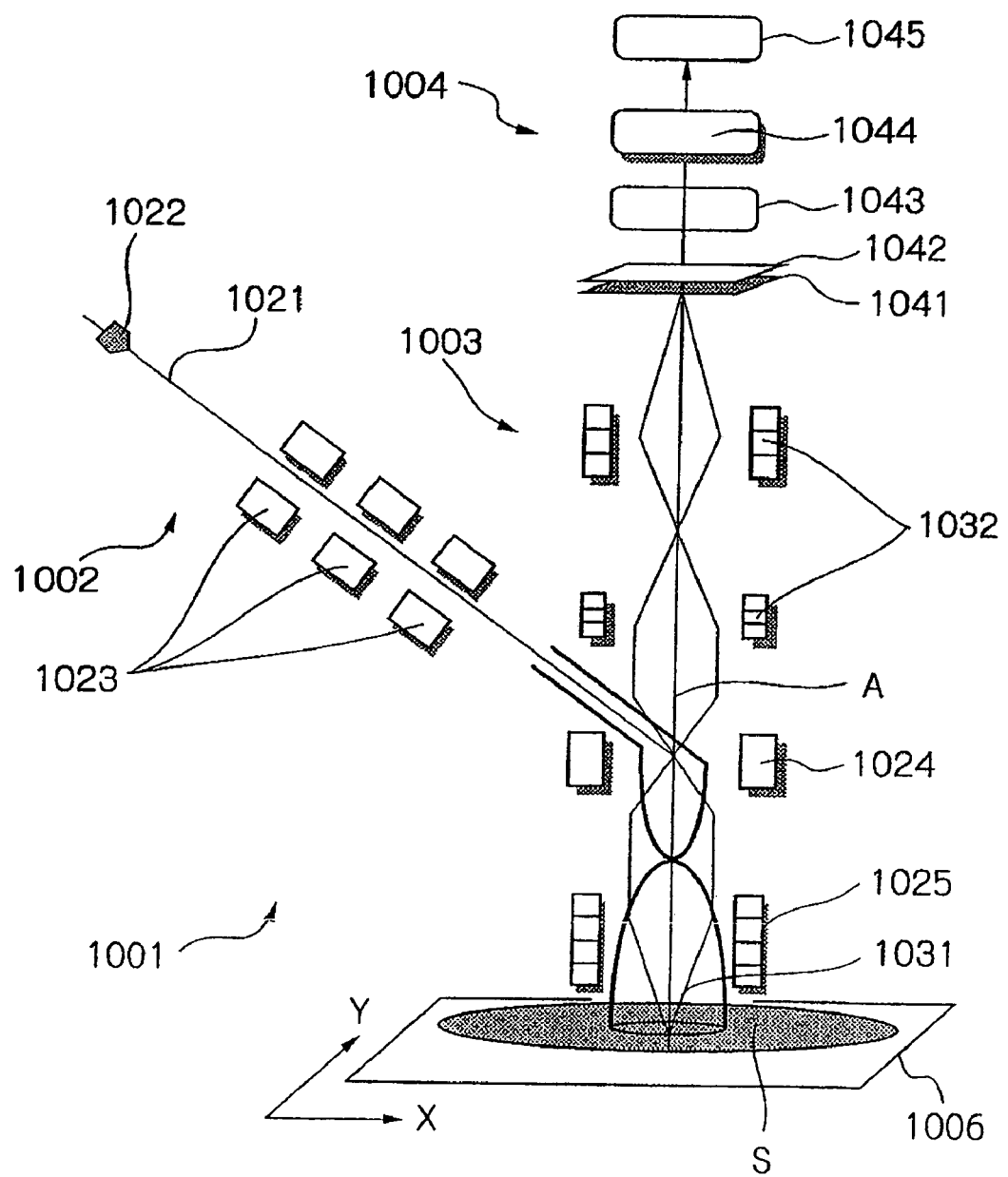
FIG. 6 is a diagram schematically showing the arrangement of an electron beam inspection system according to another embodiment of the present invention.

FIG. 6 shows schematically an electron beam inspection system 1001 for defect inspection according to this embodiment. The electron beam inspection system 1001 for defect inspection has a primary electron optical system 1002 for shaping an electron beam emitted from an electron gun into a desired configuration (e.g. a rectangular or elliptical shape) and for irradiating the shaped electron beam to a surface of a sample (e.g. a wafer or a mask; referred to as "wafer" in this embodiment) S to be inspected. The electron beam inspection system 1001 also has a secondary electron optical system 1003. The secondary electron optical system 1003 magnifies and projects secondary electrons emitted from the wafer S onto a detector 1004. The electron beam inspection system 1001 also has the detector 1004. The detector 1004 converts the secondary electrons into an image of light and further converts it into an electric signal. The electron beam inspection system 1001 further has a controller 1005 (see FIG. 7) for controlling the detector 1004.

The primary electron optical system 1002 has an electron gun 1022 for emitting an electron beam 1021 and a primary system electrostatic lens unit 1023 for shaping the electron beam 1021 into a beam with a predetermined sectional configuration. As shown in FIG. 6, the constituent elements of the primary electron optical system 1002 are arranged in series at a predetermined angle to a direction perpendicular to the surface of the wafer S, with the electron gun 1022 placed at the uppermost position. The primary electron optical system 1002 further has an E×B separator 1024 for deflecting the electron beam 1021 and separating secondary electrons emitted from the wafer S by a field in which an electric field and a magnetic field intersect each other at right angles. Further, the primary electron optical system 1002 has an electrostatic objective lens 1025. The E×B separator 1024 and the electrostatic objective lens 1025 are arranged in series in a direction perpendicular to the surface of the wafer S.

The secondary electron optical system 1003 is arranged in the direction perpendicular to the surface of the wafer S along an optical axis A of secondary electrons 1031 from the wafer S separated by the E×B separator 1024 and has a secondary system electrostatic lens unit 1032 to magnify and project the secondary electrons 1031.

The detector 1004 has an MCP (Micro-Channel Plate) 1041, a fluorescent screen 1042 for converting the secondary electrons 1031 from the secondary electron optical system 1003 into a light image, a line sensor 1043 for detecting the light image, a memory 1044 for storing wafer image information detected by the line sensor 1043, and a CRT monitor 1045 for displaying the wafer image.

Figure 7:
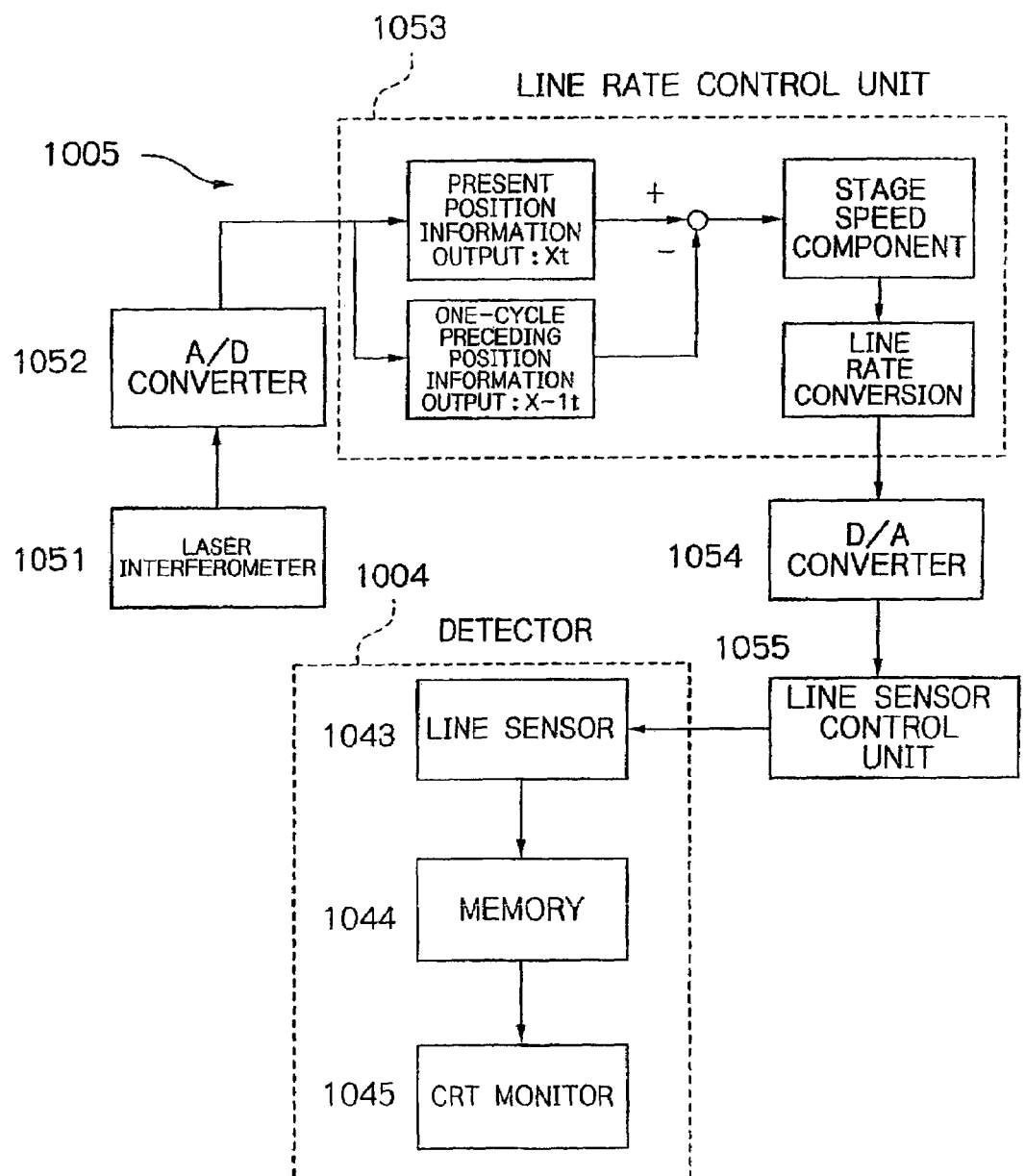
FIG. 7 is a block diagram showing in more detail a controller of the electron beam inspection system shown in FIG. 6.

As shown in FIG. 7, the controller 1005 has a laser interferometer 1051 for measuring the position of the stage, an A/D converter 1052 for converting the position signal from the laser interferometer 1051, a line rate control unit 1053 for computing an optimum line rate on the basis of the position signal from the laser interferometer 1051 and outputs the optimum line rate, a D/A converter 1054 for converting the output signal from the line rate control unit 1053, and a line sensor control unit 1055 for controlling the line sensor 1043 on the basis of the signal from the line rate control unit 1053.

The above-described constituent elements may be those publicly known. A detailed description of the structures thereof is omitted.

In the electron beam inspection system 100 arranged as stated above, electrons emitted from the electron gun 1022 are accelerated and shaped into an electron beam 1021 having a rectangular or elliptical sectional configuration through the primary system electrostatic lens unit 1023. The shaped electron beam 1021 forms a rectangular or elliptical image at a position slightly above the deflection principal plane of the E×B separator 1024. The electron beam image entering the E×B separator 1024 is deflected therein to a direction perpendicular to the surface of the wafer S and irradiated to the surface of the wafer S after being demagnified and decelerated by the electrostatic objective lens 1025.

Secondary electrons 1031 emitted from the wafer S by the electron beam irradiation are converged by the electrostatic objective lens 1025 to enter the E×B separator 1024. The secondary electron beam directed toward the secondary electrostatic lens system 1032 by the E×B separator 1024 passes through the secondary electrostatic lens system 1032 and is projected onto the MCP 1041 as a magnified image.

The secondary electrons 1031 entering the MCP 1041 are multiplied therein and are irradiated to the fluorescent screen 1042. The secondary electrons 1031 irradiated to the fluorescent screen 1042 are converted into a light image. The image is detected and converted into an electric signal by the line sensor 1043. Wafer image data converted into an electric signal is transmitted through an optical fiber cable to the memory 1044 of a personal computer where it is stored as wafer image information. The wafer image information is displayed on the CRT monitor 1045 to detect a possible defect.

Next, the operation of the controller 1005 will be described with reference to FIGS. 6 and 7. A wafer S to be inspected is placed on an X-Y stage 1006. In a case where a wafer is inspected by a method such as that described above, the X-Y stage 1006 is moved in the Y-direction at constant speed. A line rate calculated from the X-Y stage driving speed and the pixel size on the wafer is set in the line sensor control unit 1055 as a constant, and the image of the line sensor 1043 is displayed on the CRT monitor 1045. If the moving speed of the X-Y stage 1006 and the line rate are not synchronized with each other, several fringe patterns appear synchronously with variations in speed of the X-Y stage 1006 and perpendicularly to the stage scanning direction. This causes the image to be blurred.

To solve the problem of image blur due to the fringe patterns, the controller 1005 performs the following control. The position of the X-Y stage 1006 during movement thereof is measured with the laser interferometer 1051. The serial output signal from the laser interferometer 1051 is converted into a digital signal in 16 bits at a clock frequency of 200 MHz by the A/D converter 1052, and present stage position information Xt is output to the line rate control unit 1053. In addition, position information Xt−1 one cycle before the present cycle, together with a delay time, is input to the line rate control unit 1053. The line rate control unit 1053 calculates a speed component of the X-Y stage 1006 from these pieces of position information and the delay time. Further, the line rate control unit 1053 computes an optimum line rate from the stage speed component and the pixel size on the wafer and outputs a signal indicating information thus obtained. The output signal is converted into an analog signal in 16 bits at a clock frequency of 200 MHz by the D/A converter 1054. The analog signal is input to the line sensor control unit 1055. The line rate of the line sensor 1043 is controlled by the signal from the line sensor control unit 1055. The line rate of the line sensor 1043 is updated by the command from the line sensor control unit 1055. Thus, the image blur can be avoided. In this case, the overall time delay in the controller 1005, including the input and output operations, is sufficiently small relative to the vibration period of the X-Y stage 1006, which is well greater than several microseconds.

Figure 8:
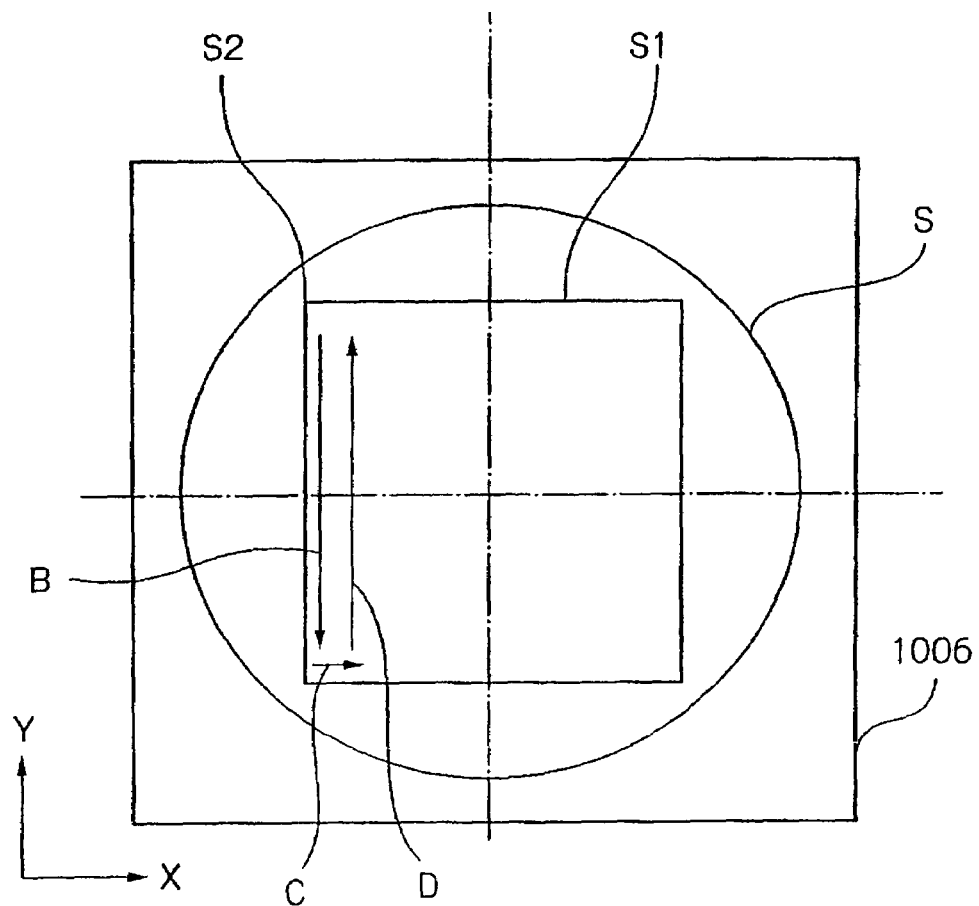
FIG. 8 is a diagram showing a wafer inspection procedure.

An actual wafer inspection was performed by using the above-described electron beam inspection system according to this embodiment. In FIG. 8, first, the top left inspection starting point S2 in a wafer inspection region S1 of about 130 mm by 130 mm was moved to the center of a region for irradiation with the electron beam 1021. Thereafter, the X-Y stage 1006 was moved in the +Y direction at 10 mm/sec. to inspect the wafer S. Consequently, the wafer inspection region S1 was inspected in the direction of the arrow B. Next, the X-Y stage 1006 was moved in the −X direction to step by about 500 microns. Consequently, the wafer inspection region S1 was shifted in the direction of the arrow C. Next, the X-Y stage 1006 was moved in the −Y direction to inspect the wafer S. In this case, the wafer inspection region S1 was inspected in the direction of the arrow D. In this way, scanning was repeated to inspect the whole wafer inspection region S1.

When scanning was performed by moving the X-Y stage 1006 from the inspection starting point S2 in the +Y direction at a stage speed of 10 mm/sec., the stage speed varied cyclically, showing a deviation of the order of ±10%, with a period of 2.5 milliseconds. In this case, the line rate having a frequency in the neighborhood of 300 kHz was cyclically oscillated synchronously with the stage speed variations by the line rate control unit 53, whereby a blur-free, favorable image was obtained.

When scanning was performed by moving the X-Y stage 1006 in the −Y direction at a stage speed of 10 mm/sec., the stage speed showed variations similar to those during the scanning in the +Y direction. However, by performing control similar to the above, a favorable image was obtained.

This embodiment provides the following advantages:

(1) An optimum line rate signal calculated in the line rate control unit is fed back to the external input terminal of the line sensor control unit for controlling the line rate of the line sensor, whereby the line rate of the line sensor is synchronized with the moving speed of the X-Y stage at all times. Accordingly, it is possible to avoid image blur which would otherwise occur owing to the charge transfer delay in the line sensor.

(2) Even when there is a change in the magnification of the electron optical system caused by the autofocusing mechanism due to the inspection of the whole surface of the wafer, image blur as caused by asynchronous charge transfer can be avoided by feeding back the optimum line rate signal calculated in the line rate control unit to the external input terminal of the line sensor control unit.

(3) It is possible to actively control image blur caused by the line sensor due to vibrations of the X-Y stage or variations in the speed of the X-Y stage driving motor.

Next, another embodiment of the image projection type electron beam inspection system will be described. The electron beam inspection system according to this embodiment relates to a multi-purpose electron beam inspection system.

First, a technique relating to the image projection type electron beam inspection system according to this embodiment will be described.

In general, the image projection type electron beam inspection system has a single electron beam irradiation unit. In this case, if an electron beam is applied obliquely to the surface of a sample and an electron beam is taken out from a direction perpendicular to the sample surface, a shadow may be undesirably produced by the unevenness of the sample surface. Therefore, a Wien filter (E×B filter) is used, and the intensities of the electric and magnetic fields in the Wien filter are so set that the obliquely applied electron beam is deflected so as to be incident perpendicularly or normally on the sample surface, whereas secondary electrons from the sample are taken out in a direction perpendicular to the sample surface without being deflected.

Figure 10:
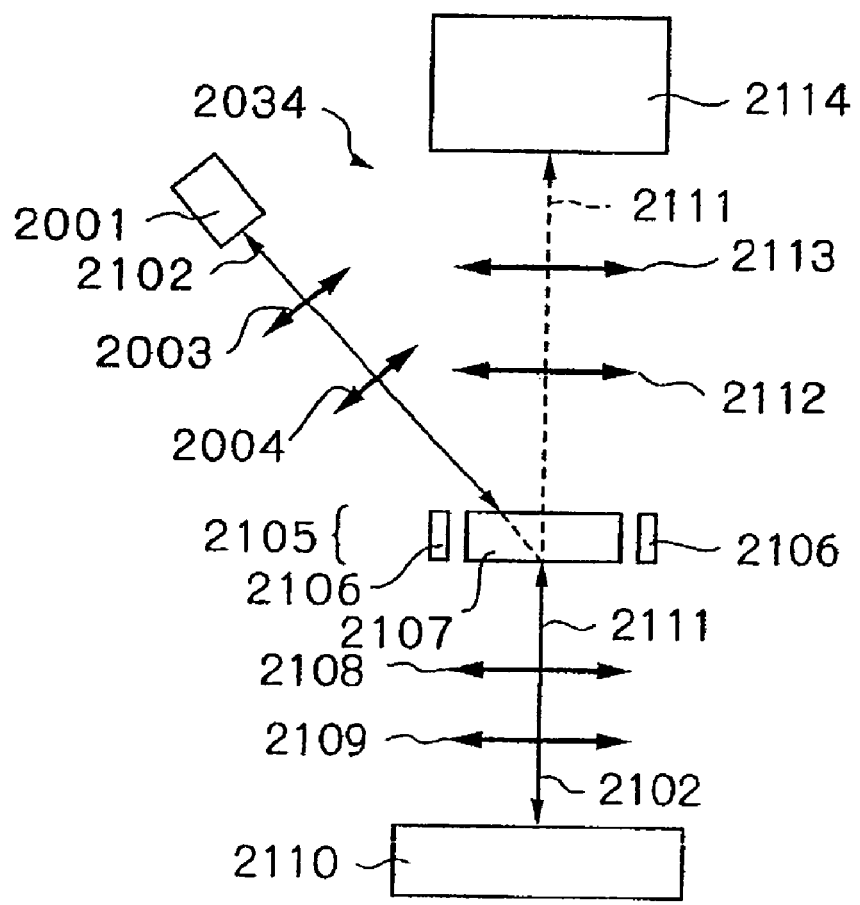
FIG. 10 is a diagram showing the arrangement of an image projection type electron beam inspection system according to the related art.

FIG. 10 is a block diagram showing the arrangement of an image projection type electron beam inspection system 2034 according to the related art. The electron beam inspection system 2034 has an electron gun 2001 for applying a primary electron beam 2102 to a sample 2110, a detector 2114 for detecting secondary electrons 2111 emitted from the sample surface by irradiation with the primary electron beam 2102 and generating an image signal, a Wien filter 2105 having electrodes 2106 and magnets 2107, a first lens system 2003 and a second lens system 2004 for shaping the primary electron beam 2102, a third lens system 2108 and a fourth lens system 2109 positioned between the Wien filter 2105 and the sample 2110, and a sixth lens system 2112 and a seventh lens system 2113 positioned between the Wien filter 2105 and the detector 2114. In the electron beam inspection system, the Wien filter 2105 is set so as to deflect the primary electron beam 2102 emitted from the electron gun 2001 but allow the secondary electrons 2111 emitted from the sample surface to travel straight. The Wien filter 2105 makes the primary electron beam 2102 incident perpendicularly or normally on the sample surface. This type of system is disclosed, for example, in Japanese Patent Application Unexamined Publication (KOKAI) No. Hei 11-132975.

The above-described electron beam inspection system is a single-purpose system. As the wafer size increases from 8 inches through 12 inches to 15 inches, the floor area of the electron beam inspection system becomes larger. Moreover, because of the need to perform various inspecting and measuring operations, the proportion of the floor area occupied by the electron beam inspection system in the clean room of semiconductor production facilities increases unfavorably.

An object of this embodiment is to provide an electron beam inspection system having a plurality of functions by itself, thereby allowing in-process wafers to be inspected with a reduced number of electron beam inspection systems. Another object of this embodiment is to provide an electron beam inspection system having a plurality of functions, thereby reducing the proportion of the floor area occupied by the electron beam inspection system in the clean room of semiconductor production facilities. Other objects and advantages of this embodiment will become apparent from the following description.

Thus, the image projection type electron beam inspection system for defect inspection according to this embodiment is a multi-purpose electron beam inspection system for inspecting the condition of the surface of a sample by irradiating a primary electron beam to the sample and detecting secondary electrons emitted from the sample surface. The multi-purpose electron beam inspection system has an electron source for generating a primary electron beam, a lens system for shaping the primary electron beam, an optical system for directing the primary electron beam for scanning, a sample stage for supporting a sample, and an optical system for directing secondary electrons toward a detector, and the detector for detecting the secondary electrons to generate an image signal. The multi-purpose electron beam inspection system further has at least two functions selected from among defect detection on the sample surface, defect review on the sample surface, pattern line width measurement, and pattern electric potential measurement. The two functions may be the sample surface defect detection and the sample surface defect review.

In the multi-purpose electron beam inspection system according to this embodiment, the sample surface defect detection may be effected by comparing an image obtained from the image signal with pattern data or by comparing the images of dice with each other. The sample surface defect review may be performed by observation of an image on a monitor obtained by beam scanning synchronized with the scanning of the primary electron beam over the wafer surface.

The pattern line width measurement may be made on the basis of a secondary electron image obtained when the primary electron beam is directed for scanning over the wafer surface in the direction of the short side of a pattern. The pattern electric potential measurement may be carried out in such a manner that a negative electric potential is applied to the electrode closest to the sample surface, whereby secondary electrons emitted from a pattern on the sample surface that has a high electric potential are selectively driven back toward the sample.

The multi-purpose electron beam inspection system according to this embodiment inspects the condition of the surface of a sample by applying a primary electron beam to the sample and detecting secondary electrons emitted from the sample surface. The multi-purpose electron beam inspection system has a lens system capable of shaping the primary electron beam into at least two configurations selected from among rectangular, circular and spot-shaped configurations, a primary electron optical system having a deflection system for moving the electron beam in a desired direction for scanning, and a detection system for directing secondary electrons emitted from the sample surface toward a detector. The multi-purpose electron beam inspection system has the function of automatically detecting a possible defect and the function of outputting information concerning the position of a detected defect and further has the function of allowing observation of the configuration of the defect. The detection system may include an image projection optical system. Further, the detection system may include a secondary electron multiplier.

A plurality of multi-purpose electron beam inspection systems according to this embodiment may be combined together as follows. A group of multi-purpose electron beam inspection systems may be disposed in one or more lines. The group of multi-purpose electron beam inspection systems may share a common sample stage and inspect a sample on the common sample stage. Each of the multi-purpose electron beam inspection systems may be arranged to irradiate a plurality of primary electron beams to a sample. Such a combination makes it possible to increase the throughput (the number of samples inspected per unit time) at the inspection step.

The multi-purpose electron beam inspection system for defect inspection according to this embodiment will be described below more specifically with reference to the accompanying drawings.

Figure 11:
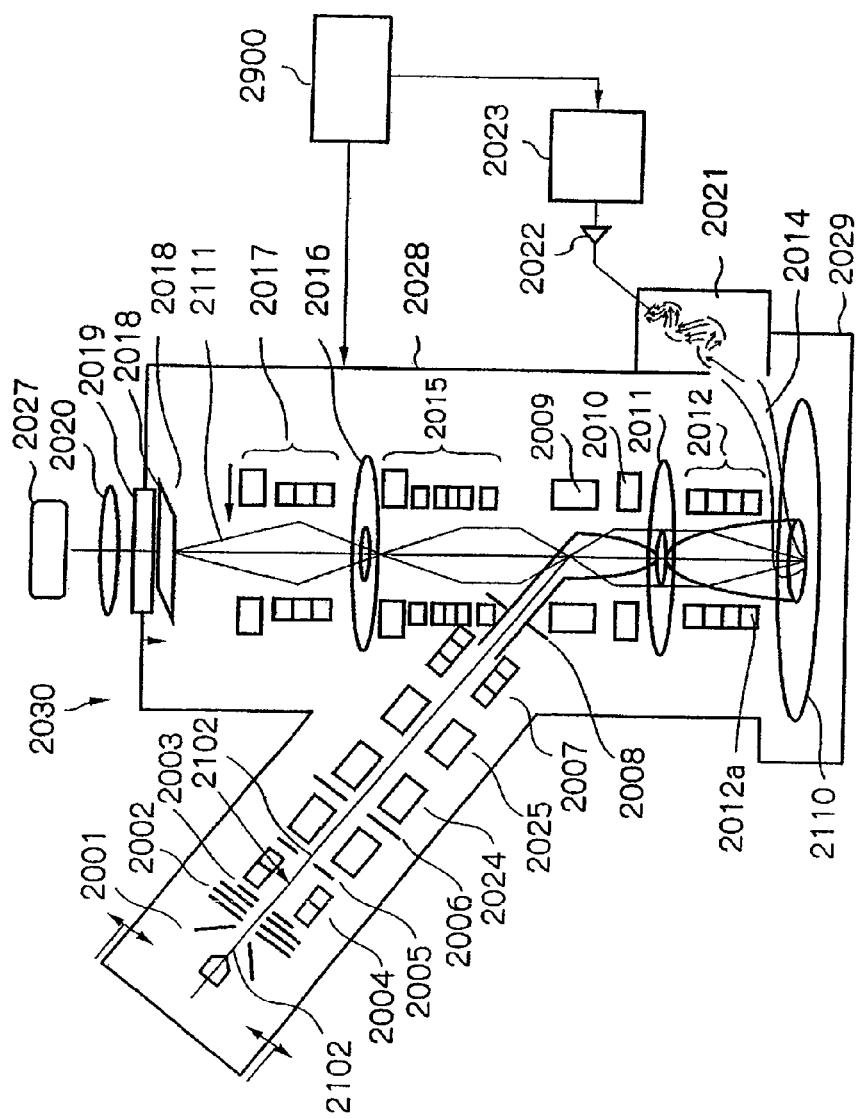
FIG. 11 is a diagram showing the arrangement of an image projection type electron beam inspection system according to still another embodiment of the present invention.

FIG. 11 is a schematic view showing a multi-purpose electron beam inspection system 2030. The multi-purpose electron beam inspection system 2030 has a optical column 2028 containing an electron gun 2001 for generating a primary electron beam 2102. The multi-purpose electron beam inspection system 2030 further has a shield casing 2029 covering the lower part of the optical column 2028. The shield casing 2029 accommodates a wafer (sample) 2110. The shield casing 2029 is communicated with the lower part of the optical column 2028 and evacuated to create a vacuum therein as in the case of the inside of the optical column 2028. The optical column 2028 contains, in addition to the electron gun 2001, condenser lenses 2002, 2003 and 2004 for irradiating the primary electron beam 2102 to the surface of the wafer 2110, a rectangular aperture 2005, a circular aperture 2006, a deflector 2007, a Wien filter 2009, lens systems 2012, 2010, 2015 and 2017 acting on secondary electrons emitted from the surface of the wafer 2110 irradiated with the primary electron beam 2102, a microchannel plate 2018, a scintillator 2018', and an optical fiber bundle 2019. When made of a stainless steel, the shield casing 2029 needs magnetic shielding. When made of a ferromagnetic material, the shield casing 2029 can dispense with magnetic shielding.

In the electron beam inspection system 2030, the primary electron beam 2102 emitted from the electron gun 2001 is irradiated to the surface of the wafer (sample) 1110 through the condenser lenses 2002, 2003 and 2004, the rectangular aperture 2005, the circular aperture 2006, the lenses 2024 and 2025, the deflector 2007, the Wien filter 2009, and so forth. The primary electron beam 2102 emitted from the electron gun 2001 is converged through the condenser lenses 2002, 2003 and 2004 and is incident to the rectangular aperture 2005 or the circular aperture 2006 behind it with a uniform intensity. In the system shown in FIG. 11, a demagnified image of the rectangular aperture 2005 or a demagnified image of the circular aperture 2006 or a demagnified crossover image can be selectively formed on the surface of the wafer 2110 by adjusting the lenses 2024 and 2025. In addition, the wafer surface can be scanned with the primary electron beam 2102 by activating the deflector 2007.

In the electron beam inspection system 2030 shown in FIG. 11, an image of the wafer surface is produced as follows. Secondary electrons emitted from the surface of the wafer 2110 irradiated with the primary electron beam 2102 are focused onto the microchannel plate 2018 through the lens systems 2012, 2010, 2015 and 2017 and converted into an image of light by the scintillator 2018' on the rear side of the microchannel plate 2018. The light image is taken to the outside through the optical fiber bundles 2019 and 2020 and converted into an electric signal by a two-dimensional CCD 2027. Thus, an image is produced. The produced image is compared with pattern data (automatic pattern alignment procedure). Alternatively, images produced at the same positions on adjacent dies (i.e. adjacent chips fabricated on the same wafer) are compared with each other. That is, the adjacent dice are compared with each other (defect comparison system). Thus, it is possible to automatically detect a possible defect and output the position of a detected defect (defect post-processing system). Thus, the electron beam inspection system 2030 has the function of the image projection type electron beam inspection system.

In the electron beam inspection system 2030 shown in FIG. 11, the brightness of a monitor 2023 is modulated as follows. A specific voltage is applied to the lens system 2012 adjacent to the surface of the wafer 2110, thereby directing the path 2014 of the secondary electrons toward a secondary electron multiplier 2021 adjacent to the edge of the wafer surface. Thus, the secondary electrons are multiplied in the secondary electron multiplier 2021 to obtain an electric signal, which is then amplified by an amplifier 2022 to use it for the brightness modulation of the monitor 2023.

In the multi-purpose electron beam inspection system 2030 shown in FIG. 11, inspection for a defect on the wafer surface may be performed as follows. The deflector 2007 is activated to scan the monitor 2023 with the beam synchronously with the scanning of the surface of the wafer 2110 with the primary electron beam 2102. The image thus obtained, that is, SEM image, and a pattern data image are compared with each other to detect a possible defect on the wafer surface. Thus, the electron beam inspection system 2030 also has the function of the electron beam inspection system using the scanning electron beam system (SEM system). Accordingly, if the wafer surface is scanned with the primary electron beam in the direction of the short side of a rectangular pattern, for example, by activating the deflector 2007, the line width of pattern lines arrayed along the long-side direction of the pattern can be measured on the basis of the secondary electron image obtained by the monitor 2023.

Further, regardless of whether the electron beam inspection system 2030 is used as an image projection type inspection system or as a scanning electron beam type inspection system, the pattern electric potential can be evaluated. That is, a negative electric potential is applied to the electrode 2012a closest to the wafer 2110 among the electrodes in the lens system 2012 adjacent to the surface of the wafer 2110, whereby secondary electrons emitted from a pattern on the wafer surface that has a high electric potential are selectively driven back toward the wafer 2110, thereby evaluating the electric potential of the pattern. Thus, it is possible to perform even more accurate inspection for electrical conduction failures (opens, shorts, etc.), that is, contact failures, occurring in the wafer 2110.

The electron beam inspection system 2030 can be switched between the image projection type inspection system and the scanning electron beam type inspection system by operating a controller 2900.

The multi-purpose electron beam inspection system according to this embodiment can perform multi-purpose inspection and measurement, i.e. defect detection, defect review, pattern line width measurement, and pattern electric potential measurement, by itself as stated above.

Therefore, it does not occupy a wide floor area in the clean room. Accordingly, an increased number of device fabrication systems can be installed in the clean room. Thus, the clean room can be utilized effectively.

Next, a further embodiment of the image projection type electron beam inspection system will be described. The electron beam inspection system according to this embodiment is suitable for performing shape observation and defect inspection of high-density patterns having a minimum line width of 0.1 micron or less, with high accuracy and high reliability.

As stated above, with the achievement of high-integration density semiconductor devices, it has become necessary to inspect the surfaces of substrates, e.g. semiconductor wafers, for defects with high accuracy. To meet the demand, an image projection type electron beam inspection system has been proposed. The system operates as follows. The surface of a sample is irradiated with a primary electron beam from an electron gun. A secondary electron beam generated from the sample by the electron beam irradiation is focused onto a microchannel plate to multiply the secondary electrons. Thereafter, the secondary electron beam is converted into light representing the intensity of the secondary electron beam by a scintillator. The light is detected and converted into an electric signal by a TDI-CCD. The electric signal is synchronized with the scanning of the sample, thereby obtaining continuous images.

However, the image projection type electron beam inspection system requires that the stage moving direction should be made coincident with the light-receiving surface array direction of the TDI-CCD with high accuracy. The alignment accuracy depends on mechanical accuracy such as processing accuracy at the time of fabrication and assembling accuracy. However, it is difficult with the related art to attain the necessary accuracy for recent systems intended to perform shape observation and defect inspection of high-density patterns having a minimum line width of 0.1 micron or less.

An object of this embodiment is to provide an electron beam inspection system allowing high-precision alignment between the sample scanning direction and the TDI-CCD light-receiving surface array direction, which has heretofore been impossible to attain owing to the dependence on the mechanical accuracy, thereby making it possible to perform shape observation and defect inspection with high reliability.

Accordingly, the image projection type electron beam inspection system for defect inspection according to this embodiment has an electron irradiation unit for irradiating a sample with a primary electron beam, an optical system for optically processing a secondary electron beam generated from the sample by the primary electron beam irradiation to produce an image of the sample, a microchannel plate for receiving the sample image, a CCD for converting the light signal into an electric signal after a scintillator converts the output of the microchannel plate into a light signal, an image display unit for processing the output of the CCD, and a stage for moving the sample which is used to scan the sample. Between the sample and the microchannel plate, a magnetic lens is positioned to rotate the image.

The magnetic lens may be positioned between a lens in the final stage of the optical system and the microchannel plate.

The magnetic lens may be disposed at the crossover position closest to the microchannel plate.

The magnetic lens may be disposed at the image-formation position closest to the final-stage lens on the side of the final-stage lens remote from the microchannel plate.

Figure 12:
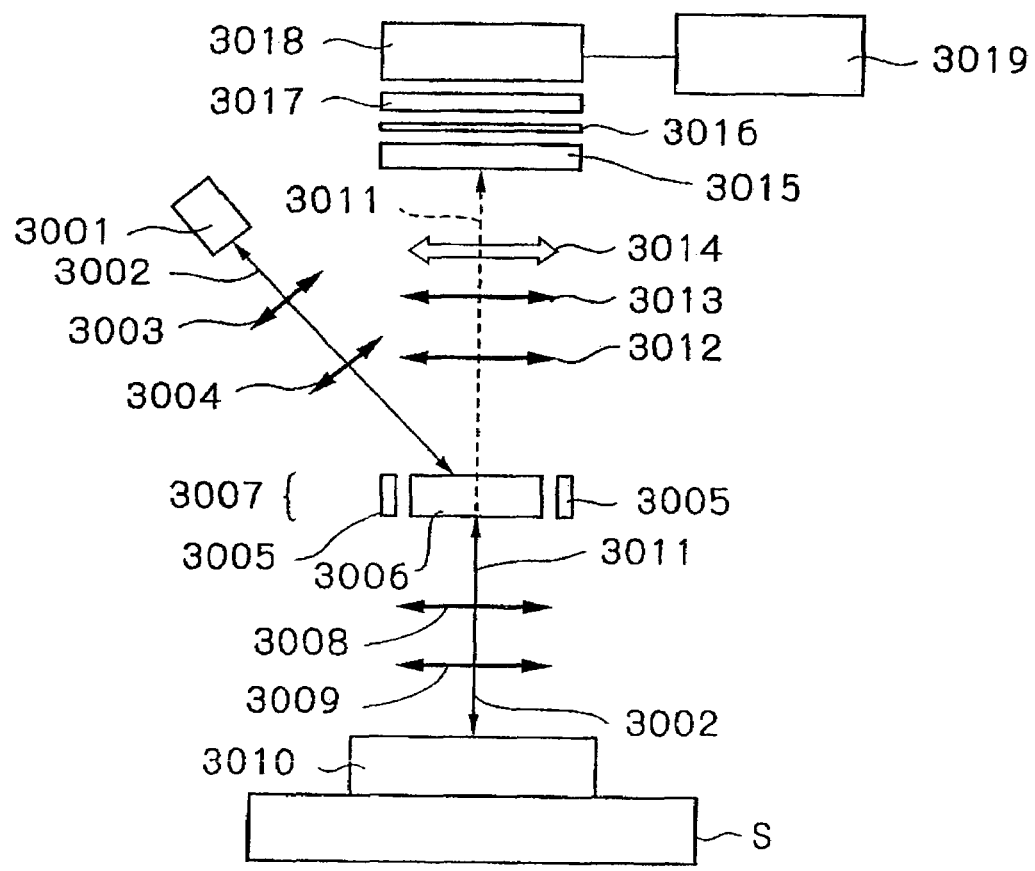
FIG. 12 is a diagram schematically showing an image projection type electron beam inspection system according to a further embodiment of the present invention.

FIG. 12 is a diagram schematically showing the arrangement of the electron beam inspection system according to this embodiment. The electron beam inspection system is implemented as an image projection type electron beam inspection system. In the figure, the electron beam inspection system has an electron gun 3001. A primary electron beam 3002 emitted from the electron gun 3001 is shaped through a rectangular aperture and enters a Wien filter 3007 having electrodes 3005 and magnets 3006 through lenses 3003 and 3004 arranged in two stages. At this time, the primary electron beam 3002 is focused onto the plane of the Wien filter 3007 as a rectangular primary electron image having a size of 1 mm by 0.25 mm, for example. The optical axis of the primary electron beam 3002 is deflected by the Wien filter 3007. Then, the primary electron beam 3002 passes through lenses 3008 and 3009, thereby being reduced to 1/5 in size. Thereafter, the primary electron beam 3002 is irradiated perpendicularly or normally onto a sample 3010 on a stage S. The sample 3010 is a wafer, for example, which has circuit patterns formed on the surface thereof.

Irradiation with the primary electron beam 3002 causes a secondary electron beam 3011 to be emitted from the surface of the sample 3010. In addition, a part of the primary electron beam 3002 is reflected at the surface of the sample 3010. The reflected electron beam and the secondary electron beam 3011 contain information representing a circuit pattern on the sample 3010. The secondary electron beam 3011 passes through the lenses 3009 and 3008 and travels straight through the Wien filter 3007. Then, the secondary electron beam 3011 travels along a path off the path of the primary electron beam 3002 and passes through lenses 3012 and 3013 of an electrostatic lens system. The secondary electron beam 3011 is magnified by the lenses 3009, 3008, 3012 and 3013.

The secondary electron beam 3011 emerging from the final-stage lens 3013 of the electrostatic lens system passes through a magnetic lens 3014 before being focused onto a microchannel plate 3015 as a rectangular image. The reason why the magnetic lens 3014 is provided will be described later. The rectangular image thus formed is intensified 10,000 times by the microchannel plate 3015 to irradiate a fluorescent unit 3016. Consequently, the fluorescent unit 3016 converts the intensified rectangular image into light. The light thus obtained passes through a relay optical system 3017 to be applied to a TDI-CCD 3018. The TDI-CCD 3018 converts the incident light into an electric signal synchronized with the scanning speed at which the sample 3010 is scanned by the moving stage and gives the electric signal to an image processing unit 3019 as a continuous image.

The image thus acquired by the image processing unit 3019 is used to detect a possible defect on the surface of the sample 3010 by on-time comparison between the images of a plurality of cells or comparison between the images of a plurality of dice. The configurational feature of a defect on the sample 3010 detected in the image processing unit 3019 and the number of defects detected, together with the coordinates of defect locations, etc., are displayed on a CRT and also recorded as the occasion demands.

It is desirable to perform the above-described shape observation and defect inspection of the sample surface by taking into consideration the fact that the substrates of different samples 3010 have different surface structures because various films, e.g. an oxide film and a nitride film, may be used, and the fact that the observation and inspection may be performed at different process steps. That is, it is desirable to irradiate charged particles to the sample 3010 under appropriate conditions to effect irradiation under optimum conditions and thereafter acquire an image to perform shape observation and defect inspection.

Although not only an image of secondary electrons but also an image of back scattered electrons and reflected electrons can be acquired as stated above, this embodiment is described with regard to a case where a secondary electron image is acquired for shape observation and defect inspection.

The operating principle of the magnetic lens 3014 shown in FIG. 12 is explained by using FIGS. 13(A) and 13(B). The magnetic lens 3014 has an annular configuration as seen from above, and its cross-section has U-shaped configurations at the left and right ends thereof. FIGS. 13(A) and 13(B) show only the central portion of the magnetic lens 3014. As shown in FIGS. 13(A) and 13(B), when the secondary electron beam 3011 passes through the center of the pole pieces of the magnetic lens 3014, a magnetic path is formed to extend through the upper pole piece 3021a and the lower pole piece 3021b by an annular coil (not shown) provided between the upper and lower pole pieces 3021a and 3021b. Thus, a magnetic field is applied to the secondary electron beam 3011. This causes the secondary electron beam 3011 to be rotated in the direction indicated by the arrow 3022 with respect to the center of the optical axis of the secondary electron beam 3011. The amount of rotation of the secondary electron beam 3011 increases as the magnetic field applied to the secondary electron beam 3011 through the pole pieces 3021a and 3021b is intensified.

The above-described principle may be utilized as follows. The magnetic lens 3014 is positioned between the lens 3013 and the microchannel plate 3015, for example, and the intensity of the magnetic field produced by the magnetic lens 3014 is controlled. By doing so, it is possible to rotate the image formed on the microchannel plate 3015 by the secondary electron beam 3011 emitted from the sample 3010. Accordingly, controlling the intensity of the magnetic field produced by the magnetic lens 3014 allows the scanning direction of the sample 3010 as scanned by the moving stage S to coincide with the integration direction on the light-receiving surface of the TDI-CCD 3018.

If the magnetic lens 3014 is positioned between the lens 3013 in the final stage of the electrostatic lens system and the microchannel plate 3015, the secondary electron beam 3011 and hence the image formed on the microchannel plate 3015 can be rotated by the magnetic lens 3014 without exerting any effect on the electrostatic lens system (e.g. an undesired change in the magnification of the electrostatic lens system, or introduction of aberration or distortion into the image).

We actually positioned the magnetic lens 3014 between the final-stage lens 3013 and the microchannel plate 3015 as shown in FIG. 12. After the scanning direction of the sample 3010 and the light-receiving surface array direction of the TDI-CCD 3018 had been mechanically aligned in advance so that the angular displacement between the two directions was within ±1 degree, the rotational angle of the secondary electron beam 3011 was measured at various magnetic field strengths of the magnetic lens 3014. The results of the measurement revealed that the secondary electron beam 3011 can be rotated in the range of angles of ±10 seconds. That is, it is only necessary for the angle accuracy to satisfy the relationship of (field size/2)×(angle accuracy)<(1/10)×(pixel size). Hence, the angle accuracy $<(1/2048\times5)$ rad$=9.77\times10^{-5}$ rad=20.2 seconds.

Figure 15:
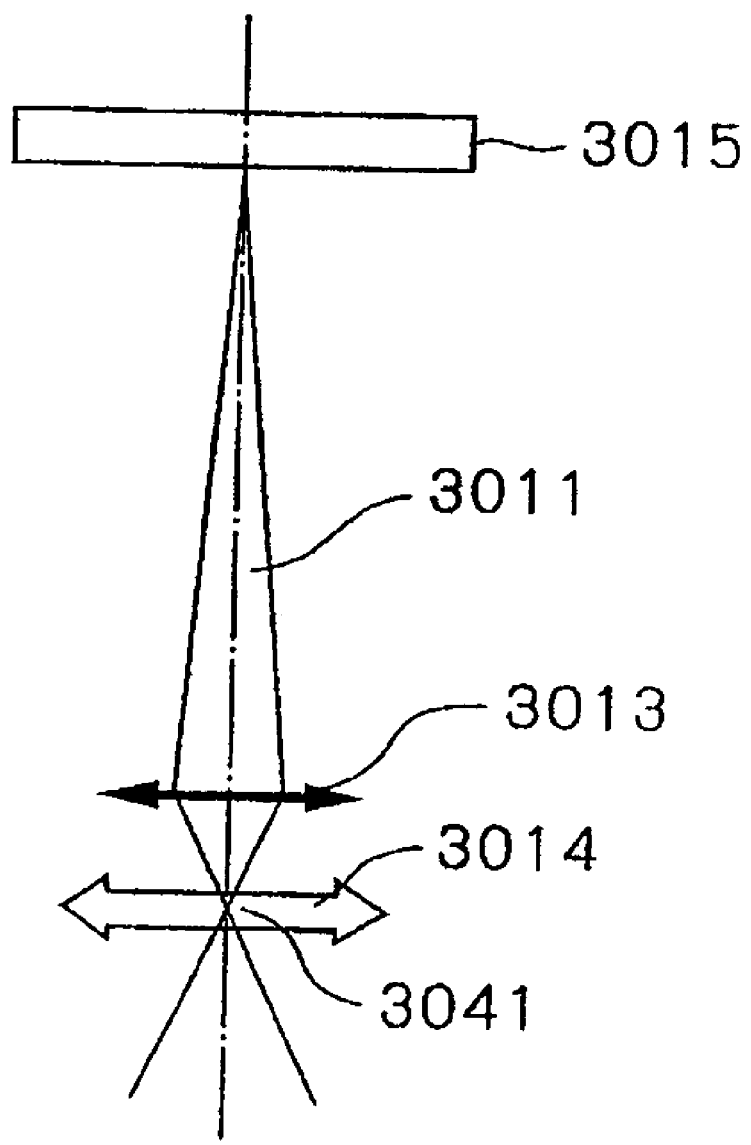
FIG. 15 is a diagram showing another example of placement of the magnetic lens shown in FIG. 12.

It is desirable that the above-described magnetic lens 3014 should be provided at the position shown in FIG. 14 or 15. In FIG. 14, the magnetic lens 3014 is positioned at the crossover position 3031 closest to the final-stage lens 3013 of the electrostatic lens system between the lens 3013 and the microchannel plate 3015, as has been stated above. This arrangement makes it possible to utilize the action of the magnetic lens 3014 to rotate the secondary electron beam 3011. Moreover, the influence on the focusing conditions of the electrostatic lens system in the image projection system can be reduced to a substantially ignorable level.

In FIG. 15, the magnetic lens 3014 is provided at the image-formation position 3041 closest to the final-stage lens 3013 of the electrostatic lens system on the side of the lens 3013 remote from the microchannel plate 3015. The image-formation position 3041 is conjugate to the surface of the sample 3010 and also to the secondary electron beam incident surface of the microchannel plate 3015. The image-formation position 3041 is where no lens action other than the rotating action of the magnetic lens 3014 takes place. Therefore, the magnetic lens 3014 only acts to correct the displacement between the scanning direction of the sample 3010 and the light-receiving surface array direction of the TDI-CCD 3018. In other words, such directional displacement can be corrected easily by the magnetic lens 3014. Further, because the rotating action of the magnetic lens 3014 exerts no influence on the electrostatic lens system of the image projection system and hence causes no aberration or distortion, the arrangement shown in FIG. 15 can attain a high degree of accuracy, which is equal to or higher than the accuracy obtained by the arrangement shown in FIG. 14.

As will be understood from the foregoing description of the electron beam inspection system, the present embodiment allows the sample scanning direction and the light-receiving surface array direction of the TDI-CCD to be readily aligned with each other. Therefore, it is possible to eliminate or minimize the image blur due to discrepancy between the two directions.

Thus, it becomes possible to effect shape observation and defect inspection with high reliability at excellent resolution, i.e. 0.1 micron or less.

Further, in this embodiment, even if the number of stages of the TDI-CCD is increased, image blur as caused by discrepancy between the sample scanning direction and the TDI-CCD light-receiving surface array direction is minimized. Therefore, it is possible to use a TDI-CCD with an increased number of stages and hence possible to provide an electron beam inspection system exhibiting even higher sensitivity. Accordingly, high throughput can be realized.

Next, a further embodiment of the electron beam inspection system will be described. This embodiment relates to an electron beam inspection system that evaluates the surface of a solid sample by using a single or plurality of electron beams. More particularly, the embodiment relates to an electron beam inspection system capable of evaluating samples, e.g. wafers or masks, having patterns with a minimum line width is 0.1 µm or less, with high throughput (i.e. the number of samples evaluated per unit time), high accuracy and high reliability. Items of evaluation include defect inspection of a sample, e.g. a semiconductor wafer, line width measurement, overlay accuracy measurement, voltage contrast measurement at high time resolution, and so forth. The voltage contrast measurement allows inspection for an electrical defect under the wafer surface and measurement of small particles on the wafer surface.

In this embodiment, the dimension D of the electron beam means the diametrical dimension (diameter of diagonal line length) of the electron beam image on the sample surface. Further, in this embodiment, the spacing between electron beams means the distance between the centers of adjacent electron beam images on the sample surface.

First, a technique relating to the electron beam inspection system according to this embodiment will be described.

This type of electron beam inspection system for evaluating defects on a sample, e.g. a wafer, is disclosed, for example, in Japanese Patent Application Unexamined Publication (KOKAI) No. Hei 9-311112. This publication discloses a pattern inspection system in which a primary electron beam is applied to a sample formed with a pattern, e.g. a mask or a wafer, and secondary electrons emitted from the sample are used to inspect the pattern on the sample. Further, in the related art, a decelerating electric field is applied between an objective and the sample to narrow down the primary electron beam and the sample is irradiated with the narrowed electron beam, thereby efficiently detecting secondary electrons emitted from the sample. In addition, the related art uses a secondary electron energy filter comprising a hemispheric mesh electrode to measure the electric potential contrast of the pattern on the sample surface.

A decelerating electric field type objective used in the above-described related art allows all secondary electrons to pass through it. This makes it difficult to measure the voltage contrast. The secondary electron filter comprising a hemispheric mesh electrode has the following problems: If the mesh electrode is provided between the objective and the sample, the image plane distance of the objective lens increase, and the axial chromatic aberration coefficient increases. In addition, the primary electron beam cannot be focussed, or the beam current decreases as the primary electron beam is narrowed down. Further, the mesh electrode irregularly bends the path of the primary electron beam passing near the mesh electrode. Therefore, the beam may be blurred, or scanning distortion may occur.

This embodiment is made in view of the above-described problems of the related art. Accordingly, an object of this embodiment is to provide an electron beam inspection system capable of obtaining a large beam current while narrowing down the primary electron beam and hence capable of measuring the voltage contrast and free from scanning distortion.

The electron beam inspection system according to this embodiment uses a unipotential electrostatic lens having at least three axially symmetric electrodes: an electrode closer to the electron gun (i.e. upper electrode); an electrode closer to the sample (i.e. sample-side electrode, or lower electrode); and a center electrode between the upper and lower electrodes. With the electrostatic lens, a primary electron beam is focused onto the sample surface, and the sample surface is scanned with the primary electron beam by using a deflector. Secondary electrons emitted from the sample by the primary electron beam irradiation are detected to evaluate the sample surface. The electron beam inspection system applies a voltage lower than the electric potential at the sample surface to the lower electrode, thereby obtaining the electric potential contrast of the pattern on the sample surface.

In the electron beam inspection system according to this embodiment, when evaluation that need not obtain the electric potential contrast is to be performed, a voltage close to the ground potential is applied to the sample-side electrode (lower electrode). When the voltage applied to the lower electrode is changed to a considerable extent, the focusing conditions are adjusted by varying a positive high voltage applied to the center electrode.

In the electron beam inspection system according to this embodiment, when the focusing conditions are changed slightly at high speed, the voltage applied to the electrode of the electrostatic lens that is closer to the electron gun than the center electrode (i.e. the voltage applied to the upper electrode) is controlled. In this embodiment, a contrast image is obtained from changes in the emission of secondary electrons from the sample surface under application of an electric potential distribution.

Figure 16:
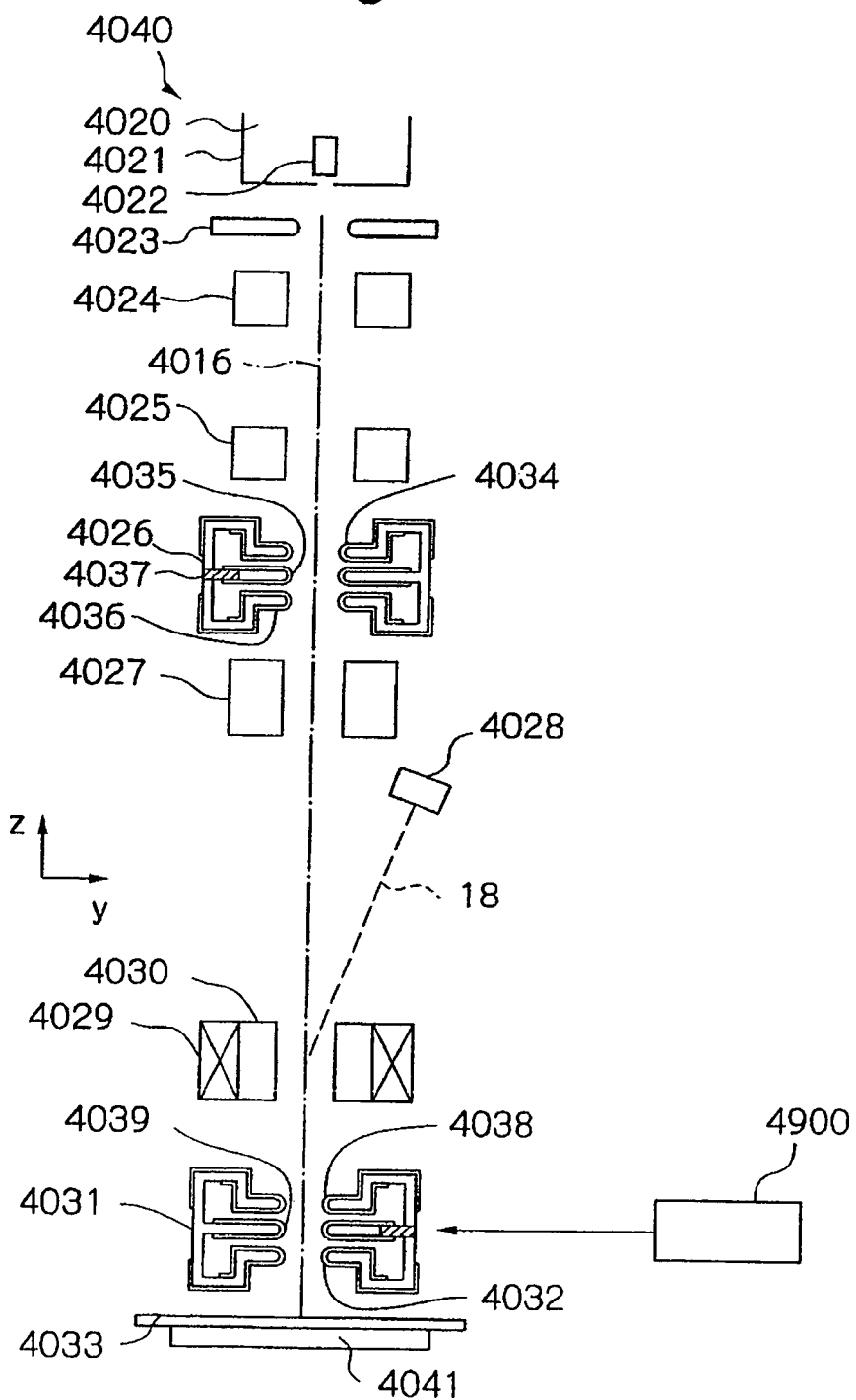
FIG. 16 is a diagram schematically showing the arrangement of an electron beam inspection system according to a further embodiment of the present invention.

The subject matter of this embodiment will be described below more specifically with reference to the accompanying drawings. FIG. 16 is a diagram schematically showing the arrangement of the electron beam inspection system according to this embodiment. As shown in FIG. 16, an electron gun 4020 has a cathode 4022 placed in a Wehnelt cylinder 4021 and an anode 4023 provided below the Wehnelt cylinder 4021. A primary electron beam is emitted from the cathode 4022 toward the anode 4023. After passing through the anode 4023, the electron beam is aligned by aligning deflectors 4024 and 4025 so as to pass through the centers of condenser lenses 4034, 4035 and 4036.

When the cathode 4022 is a thermal field emission cathode (TEF cathode), the primary electron beam emitted from the cathode 4022 is controlled by the condenser lenses 4034, 4035 and 4036 to adjust the image-formation magnification at the sample surface. The controlled primary electron beam 4016 is focused onto the surface of a sample 4033 by objective lenses 4032, 4038 and 4039. The primary electron beam 4016 forms a crossover image on the deflection center plane of an E×B separator 4030. The primary electron beam 4016 is deflected in two stages by an electrostatic deflector 4027 and an electromagnetic deflector 4029 in the E×B separator 4030 to raster-scan over the surface of the sample 4033.

In the electron beam inspection system shown in FIG. 16, inspection of the sample 4033 is performed by scanning a predetermined width of the surface of the sample 4033 in the x-direction (direction perpendicular to the plane of FIG. 16) with the primary electron beam and, while doing so, continuously moving a stage 4041 in the y-direction. Upon completion of the inspection of a predetermined region of the sample 4033 as far as the end in the y-direction, the stage 4041 is moved in the x-direction by a predetermined width or by a width slightly larger than the predetermined width to inspect a neighboring stripe (a region adjacent to the predetermined region). As the result of the primary electron beam 4016 irradiating the surface of the sample 4033 by raster scan, secondary electrons are emitted from the scanning points on the sample 4033.

Figure 18:
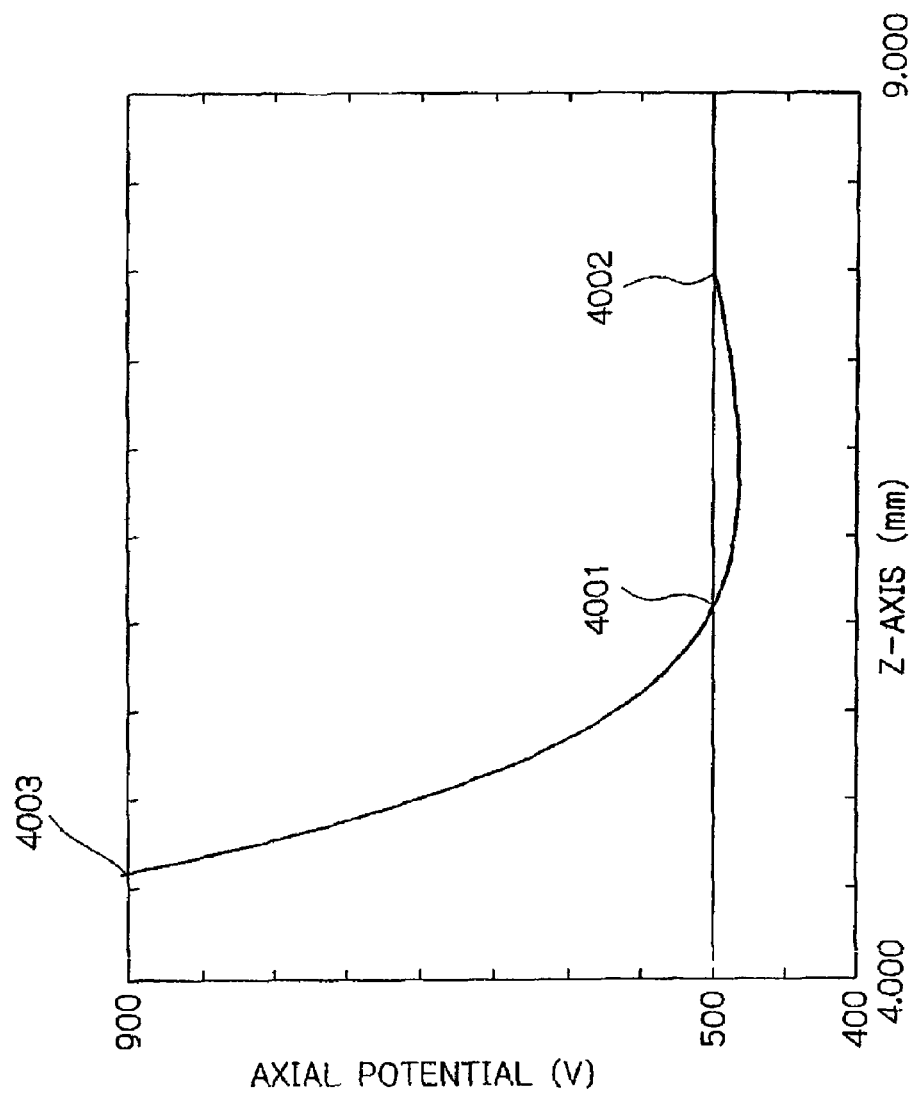
FIG. 18 is a graph showing an axial potential distribution when a voltage is applied to each of electrodes and a sample.

Secondary electrons emitted from the irradiated points on the sample 4033 are extracted toward the electron gun 4020 by an accelerating electric field for the secondary electrons that is formed by the high voltage applied to the center electrode 4039 of the objective 4031 and the ground potential at the upper electrode 4038 and the lower electrode 4032, together with the negative high voltage applied to the sample 4033. The secondary electrons are deflected from the primary optical system by the E×B separator 4030 so as to travel along the path in the direction indicated by the dotted line 18 in FIG. 16. Then, the secondary electrons are detected with a secondary electron beam detector 4028, and thus an SEM image (scanning electron microscope image) is formed. To evaluate the electric potential contrast of the sample 4033, a voltage lower than the electric potential at the sample 4033 is applied to the sample-side electrode 4032 of the objective 4031, thereby making the axial potential distribution lower than the potential at the sample surface as shown in FIG. 18 (described below). A controller 4900 shown in FIG. 16 allows a desired voltage to be applied to each of the upper electrode 4038, the center electrode 4039 and the lower electrode 4032.

FIG. 18 shows the distribution of axial potential when 4.5 kV, 8 kV, 350 V and 500 V are applied to the upper electrode 4038, the center electrode 4039, the lower electrode 4032 and the sample 4033, respectively. In FIG. 18, the abscissa axis represents the distance along a Z-axis, i.e. an axis extending perpendicularly to the surface of the sample 4033. The point of 0 mm, as a fiducial point, is the intersection between the axis and a line extending from the upper electrode 4038 at right angles to the axis. Accordingly, 4.000 mm in the figure shows the distance from the intersection. In FIG. 18, the sample 4033 (not shown in the figure) is placed at a position corresponding to the point 4002, and the lower electrode 4032 (not shown in the figure) is provided at a position corresponding to the middle between the point 4001 and the point 4002. The center electrode 4039 is provided at a position corresponding to the point 4003. Because a voltage lower than the sample potential is applied to the lower electrode 4032, the axial potential is lower than the electric potential at the surface of the sample 4033 over the range of from the point 4001 to the point 4002. Among the secondary electrons, those emitted from a pattern having a high electric potential have low potential energy and hence low speed. Therefore, such secondary electrons are driven back toward the sample 4033 by the potential barrier between the point 4001 and the point 4002. Accordingly, these secondary electrons are not detected. On the other hand, secondary electrons emitted from a pattern having a low electric potential have high potential energy and hence high speed. Therefore, these secondary electrons pass the potential barrier and reach the detector 4028.

When an electric potential lower than the sample potential is applied to the sample-side (lower) electrode 4032, a large electric field is generated between the center electrode 4039 and the lower electrode 4032. Therefore, the spacing between the center and lower electrodes 4039 and 4032 should preferably be set wider than the spacing between the upper electrode 4038 and the center electrode 4039. Further, the large electric field formed between the center electrode 4039 and the lower electrode 4032 causes the lens action to become excessively strong, resulting in a large deviation of the focusing conditions. To correct the deviation, the positive high voltage applied to the center electrode 4039 should be lowered to a considerable extent.

Figure 17:
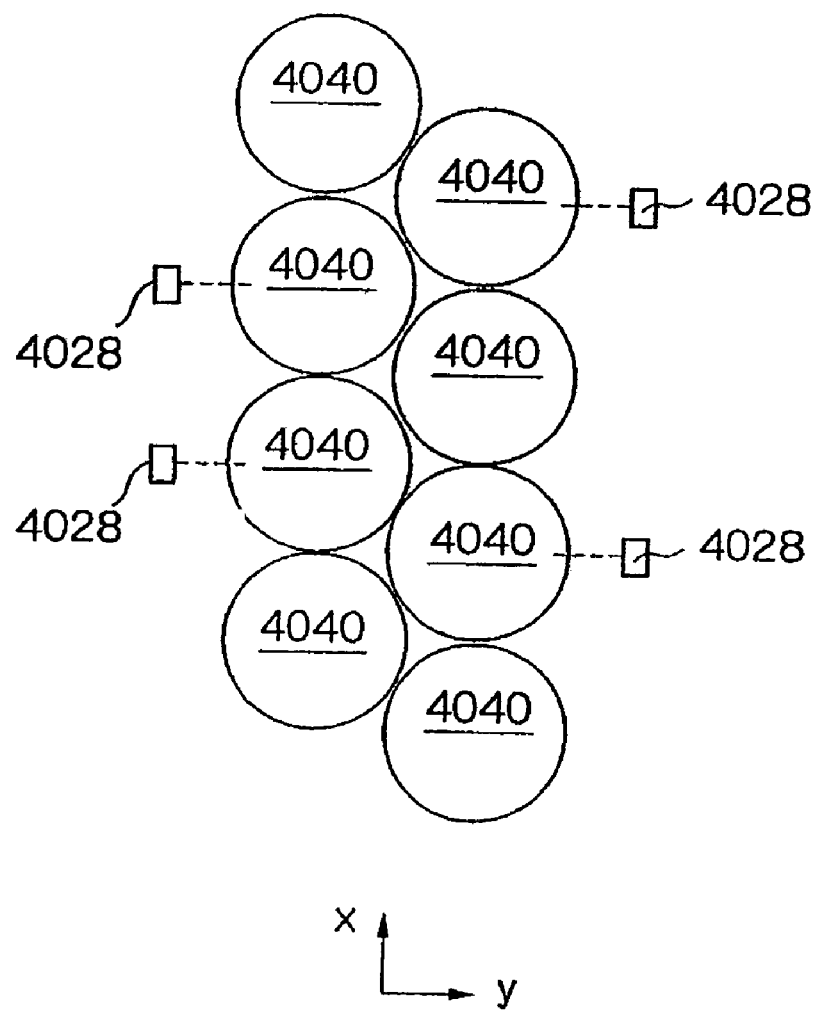
FIG. 17 is a diagram showing the layout of a multiple optical column as a modification of the single optical column of the electron beam inspection system shown in FIG. 16.

Regarding the lens structure (condenser lenses 4034, 4035 and 4036) in the electron beam inspection system shown in FIG. 16, it is preferable to form the condenser lenses 4034, 4035 and 4036 by cutting an integral ceramic member 4026 and selectively coating the surface thereof with a metal to form electrodes. By doing so, the outer diameter of an optical column 4040 can be reduced. FIG. 17 shows the way in which optical column 4040 with a reduced outer diameter are arranged in two rows each consisting of four optical column. In the example shown in FIG. 17, eight optical column 4040 are positioned above an 8-inch wafer in such a manner that each secondary electron beam detector 4028 is directed to a side where it will not interfere with neighboring optical systems. If evaluation is performed by using eight optical column 4040 (each having an outer diameter of 40 mm or less, for example) arranged as shown in FIG. 17 and moving the sample stage 4041 in the y-direction, it is possible to obtain throughput (i.e. the number of samples processed per unit time) 8 times as high as that in the case of using a single optical column 4040.

In a case where an image is produced on the basis of pattern steps or a difference in material, the secondary electron detection efficiency should preferably be increased. In such a case, an electric potential close to the ground potential should be applied to the sample-side electrode 4032. At that time, a positive high voltage is applied to the center electrode 4039. In a case where focusing is effected dynamically to respond to the unevenness and so forth of the sample surface, the voltage applied to the upper electrode 4038, which is close to the ground potential, is controlled. In this case, the control voltage can be changed at high speed.

Although the electron beam inspection system according to this embodiment has been described as a scanning electron beam (SEM) type inspection system, it should be noted that the featuring portions of this embodiment are also applicable to an image projection type electron beam inspection system.

In the electron beam inspection system according to this embodiment, a voltage lower than the electric potential at the sample surface is applied to the sample-side electrode of an electrostatic lens having three axially symmetric electrodes, whereby the electron beam inspection system is made free from the problems that the image plane distance of the objective lengthens and hence the axial chromatic aberration coefficient increases, and that the primary electron beam cannot be narrowed down. In this case, the primary electron beam is kept focused onto the sample surface by varying the positive high voltage applied to the center electrode. When it is unnecessary to obtain the electric potential contrast, a voltage close to the ground potential is applied to the sample-side electrode. By doing so, the detection of secondary electrons can be performed efficiently.

Next, a further embodiment of the present invention will be described. This embodiment relates to a charged particle beam system for applying an electron beam as a charged particle beam to a sample placed on a two- or three-dimensionally movable stage (hereinafter referred to as simply "stage") and also relates to a method of conveying a sample to the stage.

First, a technique relating to the charged particle beam system according to this embodiment will be described.

In an electron beam system as this type of charged particle beam system that irradiates a charged particle beam to a sample placed on a stage, the whole stage is installed in a vacuum container because of the necessity to place the whole charged beam path in a vacuum environment. Further, in order to allow the stage to function in a vacuum, it is necessary to give special consideration to the support structure and lubrication for the actuator and guide mechanism of the stage, the material of the stage, and so forth, unlike an arrangement in which the stage is operated in the atmospheric environment.

Regarding the actuator, for example, when a servomotor is placed in a vacuum, it needs to be designed to meet high-temperature specifications because it is difficult to effect heat dissipation under vacuum. It is also necessary to impose restrictions on the use conditions of the servomotor and to use a solid lubricant or vacuum grease for lubrication of the rotating shaft.

When the servomotor is placed on the atmosphere side, it is necessary to provide a vacuum seal mechanism, e.g. a magnetic fluid seal, in the rotation inlet part and to provide the stage with another guide in addition to an X-direction guide and a Y-direction guide to thereby construct a structure in which the servomotor need not move together with the X-direction guide or the Y-direction guide. Consequently, the structure is complicated and large in size in comparison to the stage operating in the atmospheric environment.

Regarding the support structure for the guide mechanism, an air bearing utilizing hydrostatic pressure as used for a high-precision stage used in the atmospheric environment cannot be used under vacuum environmental conditions. In the case of using a high-precision rolling bearing, e.g. a cross rolling bearing, it is also necessary to use vacuum grease or a fluorine-containing lubricant of low vapor pressure, which are inferior in lubricating properties to lubricants used in the atmospheric environment. For these reasons, it has heretofore been difficult to produce a high-precision stage for use under vacuum.

Regarding the material of the stage, it is necessary to select a material that emits a minimum amount of gas in a vacuum. An aluminum material is not frequently used. Further, it has heretofore been necessary to give special consideration to the finishing of the surfaces of the components in order to minimize the surface area of the material.

The stage mechanism for use in a vacuum requires the following constituent elements in addition to those stated above: a vacuum container for containing the stage; a load-lock chamber for transferring a sample from an atmospheric environment to a vacuum environment; a vacuum transfer mechanism for conveying the sample under vacuum; vacuum piping for the vacuum container; valves; and a vacuum pump.

Because the sample is placed in a vacuum, a vacuum chuck, which uses suction force, cannot be used as a device for holding the sample. Accordingly, it has heretofore been necessary to use an electrostatic chuck or a mechanical chuck that holds the rear surface or side of the sample with a holding member. However, the electrostatic chuck has problems that it is costly and likely to adsorb particles, and that a certain type of electrostatic chuck requires time to effect destaticization. On the other hand, the mechanical chuck is incapable of holding the sample flat and needs to hold the rear surface or side of the sample with a holding member. Therefore, the mechanical chuck cannot meet the semiconductor manufacturers' demands that the chuck should not be brought into contact with any portion of the wafer, as a sample, other than the back thereof.

As has been stated above, the charged particle beam system according to the related art requires that the stage should be provided in a vacuum environment. Therefore, the system suffers a high production cost and requires a large installation area and occupied area. Further, the mechanism is complicated, and the maintenance of the system is difficult.

In general, when an object that has been exposed to the atmospheric air is subjected to evacuation, gas molecules adsorbed on the object surface are released. Therefore, some evacuation time is required to obtain a predetermined degree of vacuum. Most of the released gas is water molecules (i.e. water vapor adsorbed on the object surface in the atmospheric environment) in a high degree of vacuum. Accordingly, when a sample that has been exposed to the atmospheric air is carried in a charged particle beam irradiation area without being satisfactorily evacuated, gas molecules adsorbed on the sample surface are released just as the sample is carried in the vacuum environment at the charged particle beam irradiation area, degrading the degree of vacuum at the charged particle beam irradiation area. Thus, the conventional system also has a problem that processing cannot be carried out with the desired performance. Accordingly, it has been demanded that the amount of gas released from the sample surface and the surfaces of components of the stage into the charged particle beam irradiation area should be reduced to a considerable extent and the released gas should be evacuated rapidly.

An purpose of this embodiment is to allow a charged particle beam system to be produced in a compact structure and at reduced costs by providing mechanical structures such as the actuator and guide mechanism of the stage in the atmospheric environment.

Another purpose of this embodiment is to prevent the sample and the charged particle beam optical system from being contaminated with particles or released gas by arranging the charged particle beam system such that only a place where a vacuum environment is required, i.e. where the sample and charged particle beam optical system are placed, is maintained under vacuum.

A further purpose of this embodiment is to provide a charged particle beam system designed so that the amount of gas released into a vacuum from the sample surface and the surfaces of the stage components can be reduced to a considerably smaller value than in the case of the conventional system.

A still further purpose of this embodiment is to provide a method of conveying a sample to the inside of a charged particle beam system designed so that the amount of gas released into a vacuum from the sample surface and the surfaces of the stage components can be reduced considerably in comparison to the conventional system.

A charged particle beam system according to this embodiment irradiate a charged particle beam to the surface of a sample placed on a stage. In order that only a place where the charged particle beam is irradiated and its vicinities should be maintained at a predetermined degree of vacuum, at least one annular differential pumping structure is provided around a region where the charged particle beam is applied, and further a structure for blowing an inert gas onto the sample surface is provided at the outer peripheral side of the differential pumping structure. With the described arrangement, it is possible to use a stage designed for use in the atmospheric environment and hence possible to produce the charged particle beam system in a compact structure and at reduced costs. Further, it is possible to prevent particles from entering from the atmosphere side to adhere to the sample surface. It is also possible to minimize the number of opportunities for the sample to come in direct contact with the atmospheric air and hence possible to reduce the amount of gas released from the charged particle beam irradiation area.

In a modification of the charged particle beam system according to this embodiment, the inert gas blowing structure is formed such that the inert gas blown onto the sample surface will flow mainly radially outward from the charged particle beam irradiation area. Thus, the pumping operation of the differential pumping unit is facilitated. Consequently, it becomes possible to form a compact differential pumping structure and to use a vacuum pump of small capacity for differential evacuation.

In another modification of the charged particle beam system, the differential pumping structure has a differential pumping passage for high vacuum and a differential pumping passage for low vacuum. These differential pumping passages connect to each other at the downstream side of the differential pumping structure to perform evacuation through the same piping at the downstream side of the junction of the pumping passages. At the upstream side of the differential pumping structure, the differential pumping passage for low vacuum offers higher pumping resistance than that of the differential pumping passage for high vacuum. Thus, it is possible to reduce the number of differential pumping passages and/or vacuum pumps and hence possible to attain reductions in size and costs of the charged particle beam system.

In another modification of the charged particle beam system, the stage is provided with a mechanism for fine height adjustment so that the surface of the stage extending under the differential pumping structure can be flush with the surface of the sample placed on the stage. Thus, there is no step between the sample surface and the stage surface. Consequently, the gap between the differential pumping unit and the stage is kept constant over the whole movable range of the stage. Therefore, it becomes possible to allow the differential pumping function to operate normally over the whole movable range of the stage.

In another modification of the charged particle beam system, either the whole movable range of a stage adapted to move a sample to a predetermined position or the movable range of the sample is always covered with a vacuum container filled with an inert gas. With this arrangement, the number of particles entering to adhere to the sample surface can be further reduced. Further, because the sample surface and the stage are not exposed to the atmospheric air, it is possible to further reduce the amount of gas released into the vacuum from the sample surface and the surfaces of the stage components.

In another modification of the charged particle beam system, the container filled with an inert gas is communicably connected with a vacuum container through a block valve, so that a sample is carried in and out of the inert gas-filled container through the vacuum container. In other words, after the sample has been inserted into the vacuum container, the vacuum container is evacuated to a predetermined pressure. Then, a high-purity inert gas is introduced into the vacuum container. Thereafter, the gate valve is opened, and the sample is placed on the stage in the container filled with the high-purity inert gas. With the described arrangement and procedure, the sample is first put in the vacuum container and once subjected to evacuation, thereby allowing a large amount of gas to be released from the sample surface and thus cleaning the sample. Thereafter, a high-purity inert gas is introduced into the vacuum container, and the sample is conveyed to the stage in the high-purity inert gas. Accordingly, when the sample is inserted into the charged particle beam irradiation area and placed in the vacuum environment, only the high-purity inert gas can be released from the sample surface. The high-purity inert gas has very small adsorption energy with respect to the surface of an object. Therefore, the high-purity inert gas is released from the sample surface within an extremely short period of time and hence will not degrade the degree of vacuum at the charged particle beam irradiation area. Thus, it is easy to maintain the charged particle beam irradiation area at a high degree of vacuum. It is also possible to minimize the likelihood that the sample surface may be contaminated.

In another modification of the charged particle beam system, an inert gas circulating mechanism is provided so that the inert gas blown onto the sample surface is recovered by a vacuum pump and/or compressor and then pressurized so as to be blown onto the sample surface again. Thus, the high-purity inert gas can be recycled and hence economized. Further, because the high-purity inert gas is not discharged into the room where the present system is installed, it is possible to eliminate the danger of accident such as suffocation by the high-purity inert gas. Examples of inert gases usable in this embodiment include nitrogen ($N_2$), argon (Ar), xenon (Xe) and the like.

Another modification of this embodiment provides a sample transporting method. That is, the method includes the following steps: preparing a charged particle beam system wherein a container filled with an inert gas is connected with a vacuum container through a gate valve, as stated above; inserting a sample into the vacuum container of the charged particle beam system; evacuating the vacuum container to a predetermined pressure; introducing an inert gas into the vacuum container; and opening the gate valve and placing the sample onto a stage in the container filled with the inert gas. The method allows the charged particle beam irradiation area to be readily maintained at a high degree of vacuum.

Another modification provides a wafer defect inspection system designed to inspect the surface of a semiconductor wafer for a defect by making use of the above-descried charged particle beam system or sample conveying method. Thus, it is possible to provide a wafer defect inspection system of high reliability that can be produced at reduced costs and requires minimum installation and foot print.

Another modification provides an exposure system designed to transfer a semiconductor device circuit pattern onto the surface of a semiconductor wafer through exposure by utilizing the above-described charged particle beam system or sample conveying method. Thus, it is possible to provide a charged particle beam exposure system of high reliability that can be produced at reduced costs and requires minimum installation and occupied areas.

Another modification provides a semiconductor manufacturing method that utilizes the above-described charged particle beam system or sample conveying method. Thus, it is possible to attain reductions in cost of the semiconductor fabrication method.

The charged particle beam system according to this embodiment will be described below in detail with reference to the accompanying drawings.

Figure 19:
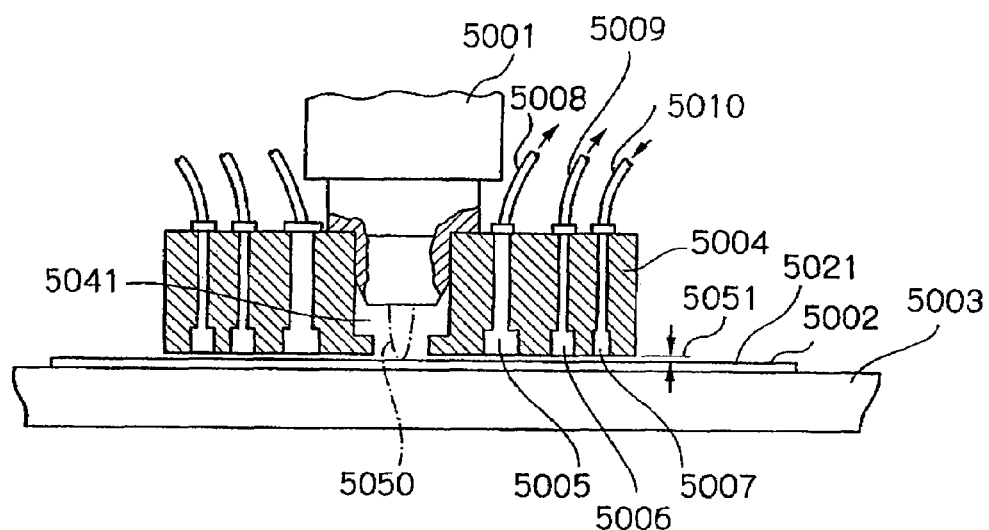
FIG. 19 is a diagram showing an embodiment of a differential pumping structure provided in a charged particle beam inspection system as an electron beam inspection system according to the present invention.

FIG. 19 is a diagram showing an embodiment of the charged particle beam system, which is an enlarged view of a part of the charged particle beam system. Reference numeral 5001 denotes an optical column having a publicly known structure for accommodating an optical system for irradiating a charged particle beam 5050 to a sample 5002. Only the distal end portion of the optical column 5001 is shown in the figure. A differential pumping unit 5004 is installed in such a manner as to surround the end portion of the optical column 5001. The differential pumping unit 5004 has a hole 5041 in the center thereof. The hole 5041 needs to be sufficiently large to pass the charged particle beam 5050 without affecting any influence thereon. The sample 5002 is placed on a stage 5003. The sample 5002 moves together with the stage 5003. The optical column 5001 is secured to a frame (see FIG. 24) of the system such that a small gap of the order of from several microns to several hundred microns is maintained between the differential pumping unit 5004 and the surface 5021 of the sample 5002 (hereinafter referred to as "sample surface 5021"). It should be noted that the optical system in the optical column 5001 is not the gist of the present invention. Therefore, a detailed description thereof is omitted.

The differential pumping unit 5004 has annular grooves 5005 and 5006 for differential pumping provided in order from the center toward the radially outer side. The annular groove 5005 is communicated with vacuum piping 5008. The annular groove 5006 is communicated with vacuum piping 5009. Gas flowing in toward the charged particle beam 5050 from the outer peripheral side of the differential evacuation unit 5004 is evacuated through the annular grooves 5005 and 5006, whereby the flow rate of gas leaking to the charged particle beam irradiation area is reduced below the allowable level, thereby maintaining the charged particle beam irradiation area at a predetermined degree of vacuum. Therefore, the configuration of the annular groove 5005, the configuration of the evacuation flow path of the annular groove 5005, the gap 5051 between the sample surface 5021 and the differential evacuation unit 5004 and the performances of the vacuum piping and the vacuum pump are determined appropriately so that the annular groove 5005 is higher in the degree of vacuum than the annular groove 5006 and the flow rate of gas leaking to the charged particle beam irradiation area is below the allowable level, or that the annular groove 5005 is higher in the degree of vacuum than the charged particle beam irradiation area. Annular grooves for performing differential pumping constitute a differential pumping structure. In FIG. 19, the annular grooves are formed in a concentric double-groove configuration. However, the present invention is not necessarily limited to the double-groove configuration. The differential pumping structure may be formed from a single annular groove or three or more concentric annular grooves, depending on the degree of vacuum required at the charged particle beam irradiation area and on the arrangement of the annular grooves, the vacuum piping and so forth.

Another annular groove 5007 is formed at the outer peripheral side of the annular groove 5006 of the differential pumping unit 5004. The annular groove 5007 is communicated with piping 5010. Through the piping 5010, a high-purity inert gas is supplied and blown off from the annular groove 5007 onto the sample surface 5021. A part of the high-purity inert gas blown off from the annular groove 5007 is discharged to the charged particle beam irradiation area by suction acting through the annular groove 5006. The rest of the high-purity inert gas flows in the opposite direction and is discharged to the outside from the outer periphery of the differential pumping unit 5004. Thus, the high-purity inert gas flows outward to act as a shield. Therefore, the atmospheric air is prevented from flowing into the charged particle beam irradiation area by the outward flow of the high-purity inert gas. If the shield mechanism effected by the high-purity inert gas is not provided, the outside air flows into the area between the sample surface 5021 and the differential pumping unit 5004. Consequently, particles and water vapor in the atmospheric air may enter the charged particle beam irradiation area and contaminate the sample surface 5021 and the lenses in the optical column 5001, which adversely affects such operations as inspection of the wafer surface using a charged particle beam and transfer of a pattern onto the wafer surface by exposure. In this regard, the provision of a high-purity inert gas blowing mechanism as in the present invention makes it possible to prevent entry of particles and water vapor in the atmospheric air and hence eliminates the likelihood of the sample and the lenses being contaminated. Accordingly, operations such as wafer inspection and exposure can be carried out without any problem.

It should be noted that if the outer peripheral portion of the differential pumping unit 5004 is extended outwardly as shown by reference numeral 5004a (see FIG. 20) to thereby increase the area covering the sample surface 5021, it is possible to prevent the entry of particles and water vapor even more surely and effectively.

Figure 20:
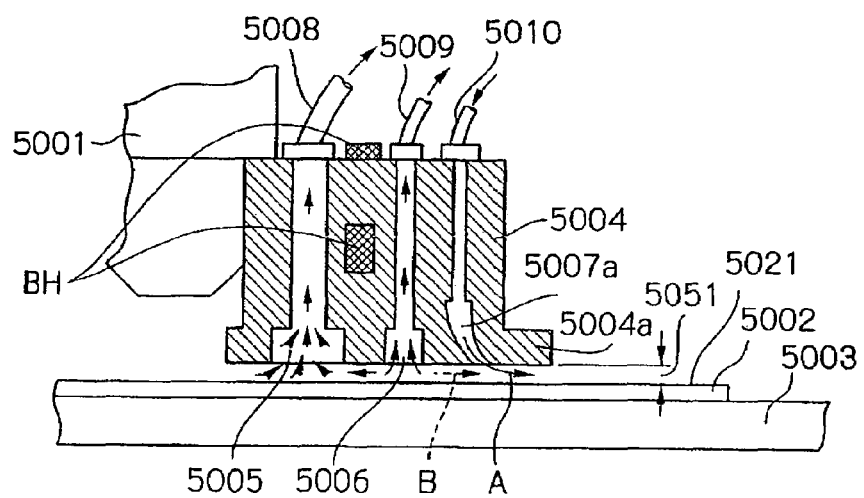
FIG. 20 is a diagram showing a modification of the differential pumping structure in which a high-purity inert gas outlet is directed toward the outer peripheral side.

FIG. 20 shows a modification of the charged particle beam system. In this modification, a high-purity inert gas outlet 5007a is directed toward the outer peripheral side. Consequently, the gas forcibly flows radially outward in the direction of the arrow A between the sample surface 5021 and the differential pumping unit 5004. If the high-purity inert gas outlet 5007a is formed as stated above and the high-purity inert gas supply pressure is raised to an appropriate value with respect to the atmospheric pressure to thereby set the velocity of the high-purity inert gas flow from the outlet 5007a to an appropriate value, the flow of the high-purity inert gas acts as an ejector, and a flow such as that indicated by the arrow B occurs. Accordingly, the inner peripheral side of the differential pumping unit 5004 can be maintained at a negative pressure. Thus, it becomes possible to further reduce the possibility that contaminants in the outside air, e.g. particles and water vapor, may enter the area between the sample surface 5021 and the differential pumping unit 5004. In addition, an pumping effect is provided. Accordingly, the load of evacuation on the differential pumping mechanism can be reduced. Thus, it is possible to attain reductions in size of the differential pumping unit 5004, the vacuum piping 5008 and 5009 and the vacuum pump.

Further, the differential pumping unit 5004 may be provided with a baking heater BH to heat the differential pumping unit 5004, whereby the gas flowing from the annular grooves 5005 and 5006 to the vacuum piping 5008 and 5009 is expanded under heating to increase the evacuation efficiency, thereby enabling a high degree of vacuum to be attained by differential evacuation even more easily.

Figure 21:
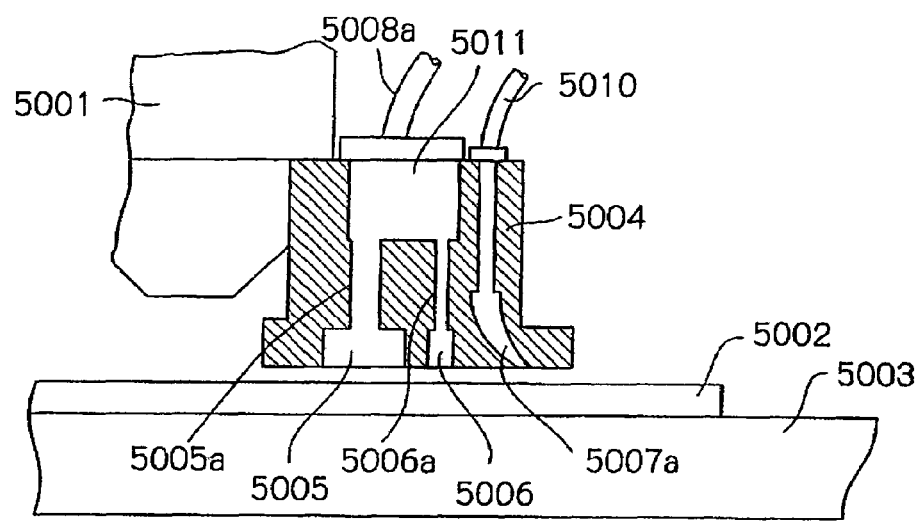
FIG. 21 is a diagram showing another modification of the differential pumping structure in which a vacuum chamber is provided in the differential pumping structure.

FIG. 21 shows another modification of the charged particle beam system. In this modification, a vacuum chamber 5011 is provided in the differential pumping unit 5004. The vacuum chamber 5011 is communicated with both a high vacuum-side evacuation passage 5005a and a low vacuum-side evacuation passage 5006a. A high vacuum-side annular groove 5005 and a low vacuum-side annular groove 5006 for differential evacuation are communicated with the high vacuum-side evacuation passage 5005a and the low vacuum-side evacuation passage 5006a, respectively. The vacuum chamber 5011 is held under vacuum through vacuum piping 5008a.

The low vacuum-side evacuation passage 5006a is formed with an extremely small conductance relative to that of the high vacuum-side evacuation passage 5005a. Accordingly, the downstream-side pressures of the evacuation passages 5005a and 5006a are both equal to the pressure in the vacuum chamber 5011, that is, equal to each other. However, the pressures in the annular grooves 5005 and 5006, which are upstream the evacuation passages 5005a and 5006a, are different from each other to a considerable extent. Thus, the annular groove 5006 maintains a low vacuum, and the annular groove 5005 maintains a high vacuum, thereby allowing differential pumping to be effected appropriately.

By forming the evacuation passages as stated above, the differential pumping unit 5004 is allowed to dispense with other vacuum piping than the vacuum piping 5008a. Accordingly, it is possible to attain reductions in size and costs of the system.

Figures 22A, 22B:
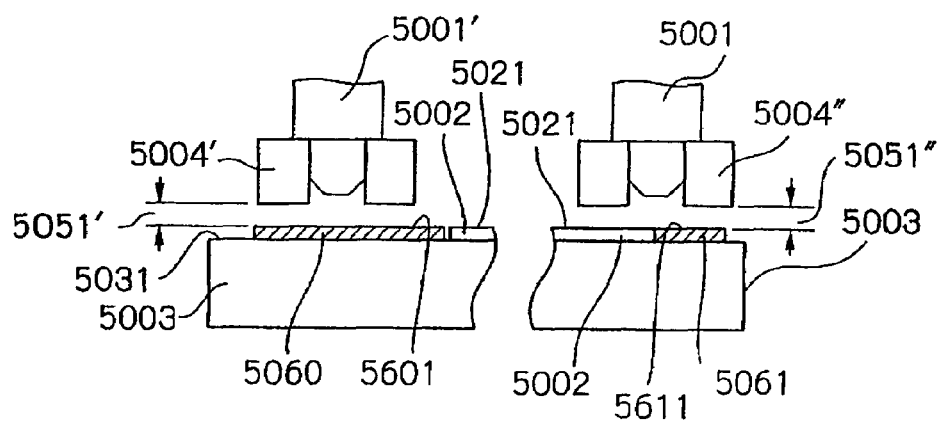
FIG. 22(a) is a diagram showing another modification of the differential pumping structure in which a member for height adjustment is provided on a stage, the diagram illustrating a state where the optical column is positioned in the vicinity of one end of the stage.
FIG. 22(b) is a diagram illustrating the modification shown in FIG. 22(a), the diagram showing a state where the optical column is positioned in the vicinity of the other end of the stage.

FIGS. 22(*a*) and 22(*b*) show another modification of the charged particle beam system. FIG. 22(*a*) shows a state where the column is positioned in the vicinity of one end of the stage. FIG. 22(*b*) shows a state where the column is positioned in the vicinity of the other end of the stage. In this embodiment, a sample 5002 is placed on the stage surface 5031, and plate members 5060 and 5061 are mounted around the sample 5002. The height of the plate members 5060 and 5061 from the stage surface 5031 has previously been adjusted so that the top surfaces 5601 and 5611 of the plate members 5060 and 5061 are flush with the sample surface 5021. By mounting such a height adjusting mechanism, the gap 5051' (or 5051") between the differential pumping unit 5004' (or 5004") and the stage surface 5031 or the sample surface 5021 is kept constant at all times even when the stage moves or the position of the column relative to the stage shifts to the position denoted by reference numeral 5001' or 5001" [FIG. 22(*a*) and FIG. 22(*b*)]. Therefore, differential pumping can be effected appropriately. Thus, the charged particle beam irradiation area can be maintained at a predetermined degree of vacuum at all times.

Figure 23:
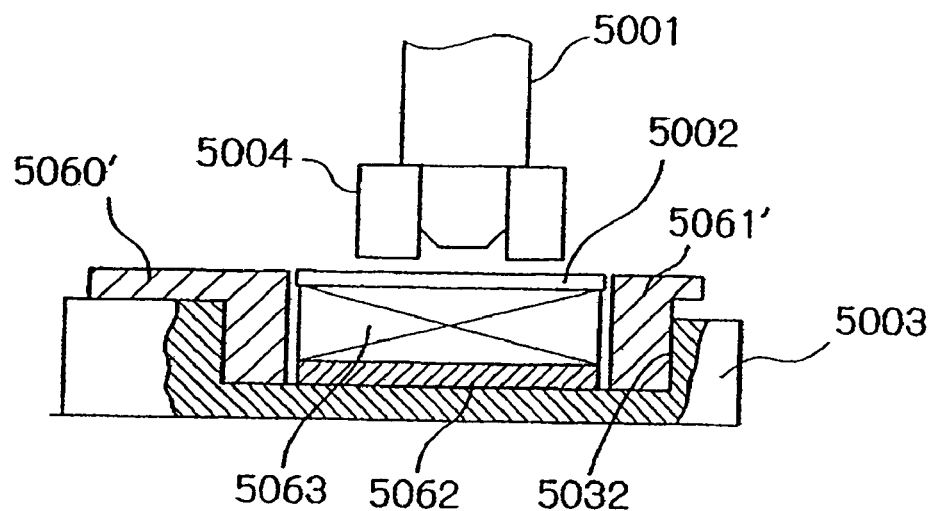
FIG. 23 is a diagram showing a modification of the charged particle beam system according to the present invention in which a height-adjusting mechanism is provided on the stage.

FIG. 23 shows another modification of the charged particle beam system. To continuously process many samples different in thickness from each other, it is necessary to allow height adjustment to be readily effected according to the thickness of each individual sample. Therefore, in this embodiment, an elevating mechanism 5062 is provided under a sample carrier (in this embodiment, a sample carrier using an electrostatic chuck, for example) 5063 for supporting and holding a sample, which is disposed in a recess 5032 of the stage 5003. By vertically moving the elevating mechanism 5062 according to the height of the sample 5002, the height of the sample surface is adjusted so that the sample surface is flush with the stage surface. The smaller the difference in height between the sample surface and the stage surface, the better. The height difference should preferably be reduced to the order of submicrons. For this reason, a fine adjustment mechanism using a piezoelectric element or the like may be provided as the elevating mechanism 5062. To process a sample 5002 having a thickness exceeding the adjustable range of the elevating mechanism 5062, the system may be arranged such that adjusting members 5060' and 5061' are provided at the sides of the sample carrier 5063, and the adjusting members 5060' and 5061' are replaced with others in conformity to the thickness of the sample 5002.

It should be noted that the adjusting members 5060' and 5061' may comprise either a single component or two or more separate components according to the configurations of the sample 5002 and the stage 5003. It is desirable to arrange the adjusting members 5060' and 5061' and the elevating mechanism 5062 so that even if the sample 5002 changes in size from an 8-inch wafer to a 12-inch wafer, the system can be adapted for any size of the sample 5002 simply by replacing the components in conformity to the sample size.

Figure 24:
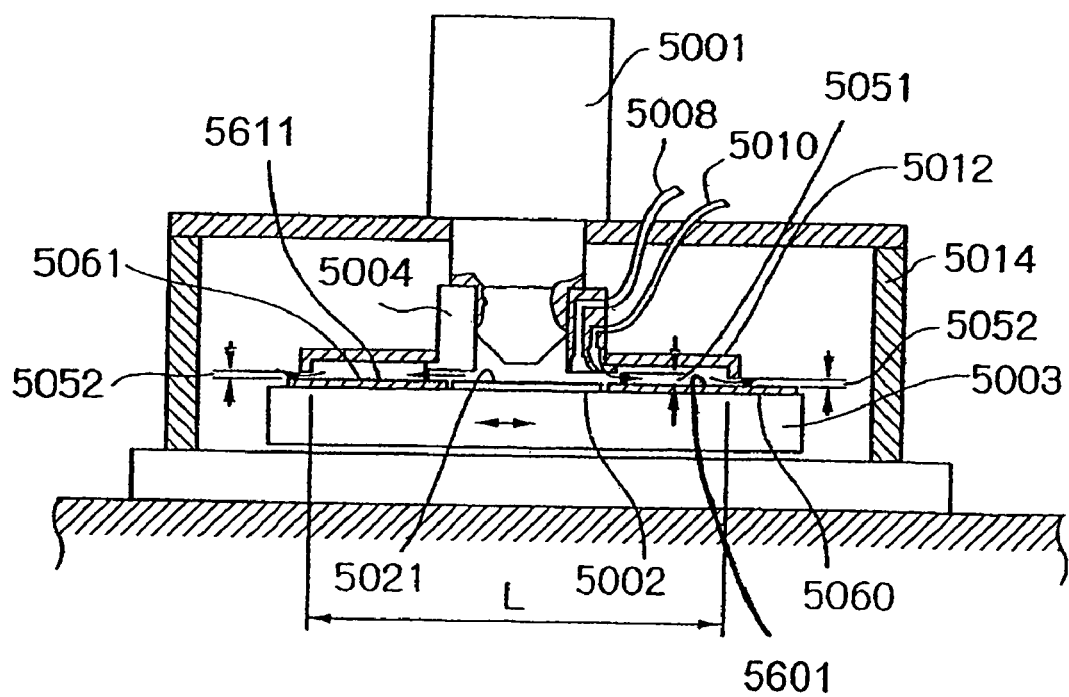
FIG. 24 is a diagram showing another modification of the differential pumping structure in which the movable range of a sample moved by the stage is covered with a container filled with an inert gas.

FIG. 24 shows another modification of the charged particle beam system. A sample 5002 is placed on the stage 5003. The sample 5002 moves within a range indicated by reference symbol L (movable range) in association with the movement of the stage 5003. Meanwhile, the column 5001 is secured to a frame 5014. The bottom of the column 5001 is provided with a differential pumping unit 5004 in such a manner that the differential pumping unit 5004 surrounds the bottom of the column 5001. Differential pumping and blowing of a high-purity inert gas are carried out in the area between the differential pumping unit 5004 and the sample surface 5021 or the top surfaces 5601 and 5611 of the plate members 5060 and 5061. A container 5012 is mounted above the stage 5003 so as to cover the movable range L of the sample 5002 completely. A small gap 5052 is provided between the sample surface 5021 or plate members 5060 and 5061 and the lower end surface of the container 5012. The high-purity inert gas blown off from the differential pumping unit 5004 enters the container 5012 through the gap 5051 between the differential pumping unit 5004 and the sample surface 5021 or the plate members 5060 and 5061. Consequently, an amount of gas that is equal to the amount of high-purity inert gas entering the container 5012 blows off to the outside of the container 5012 through the small gap 5052.

With the described arrangement, the container 5012 is always filled with the high-purity inert gas, and there is no possibility of the outside air entering the container 5012 through the small gap 5052. Thus, the inside of the container 5012 is kept clean. Therefore, even when the sample 5002 moves within the container 5012, there is no likelihood of the sample 5002 being contaminated by particles, water vapor, etc. Accordingly, it becomes easy to stabilize the charged particle beam irradiation area at a high degree of vacuum. In addition, there is no likelihood that the sample surface 5021 or the lenses in the column 5001 may be contaminated. Thus, the system can be improved in reliability and operating efficiency.

Figure 25:
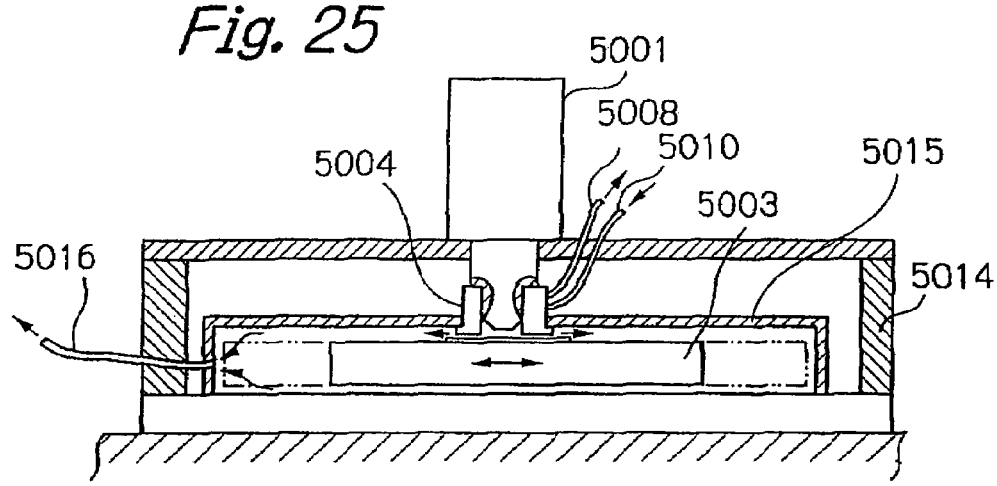
FIG. 25 is a diagram showing another modification of the differential pumping structure in which the whole movable range of the stage is covered with a container filled with an inert gas.

FIG. 25 shows another modification of the charged particle beam system. In this modification, a container 5015 is formed so as to completely surround not only the sample movable range but also the stage 5003, unlike the arrangement shown in FIG. 24. The high-purity inert gas blown off from the differential pumping unit 5004 is evacuated through a vacuum pipe 5016. The arrangement of this modification also provides advantageous effects similar to those of the modification shown in FIG. 24. Furthermore, because in this modification the container 5015 covers the stage 5003 completely, it is possible to completely eliminate the possibility of contaminants such as particles and water vapor entering from the outside. Accordingly, the system can be further improved in reliability and operating efficiency.

It should be noted that both the container 5012 in FIG. 24 and the container 5015 in FIG. 25 only require to make the pressure therein slightly higher than the atmospheric pressure so that the high-purity inert gas can be evacuated through the gap 5052 or the vacuum pipe 5016. Accordingly, containers having a simple structures such as covers will be sufficient to serve as the containers 5012 and 5015. The provision of the container 5012 or 5015 has only a little effect on the size and costs of the system.

Figure 26:
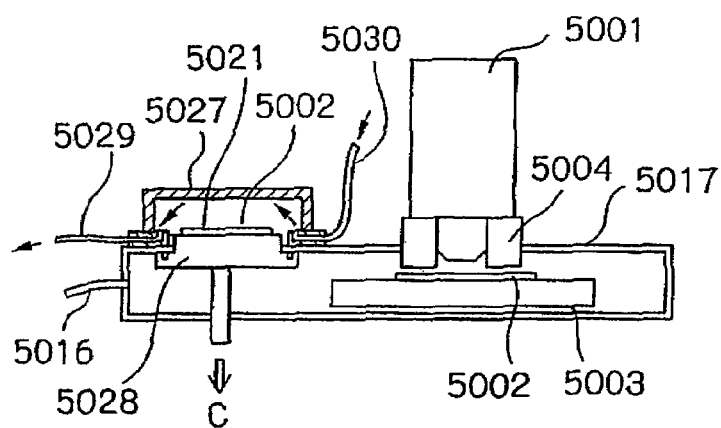
FIG. 26 is a diagram showing another modification of the differential pumping structure in which a vacuum chamber is communicably connected to a container filled with an inert gas.

FIG. 26 shows another modification of the charged particle beam system. This modification is provided with a container 5017 that covers the stage 5003 completely and is filled with a high-purity inert gas as in the case of the modification shown in FIG. 25. The container 5017 is communicably connected with a vacuum container 5027 for loading and unloading a sample. The vacuum container 5027 is connected with vacuum piping 5029 and high-purity inert gas supply piping 5030. Further, a block valve 5028 is provided between the vacuum container 5027 and the container 5017.

With the above-described arrangement, the charged particle beam system according to this modification performs processing by the following method.

First, the lid (not shown) of the vacuum container 5027 is opened, and a sample 5002 to be processed with a charged particle beam is inserted into the vacuum container 5027. Then, the lid is closed hermetically, and the vacuum container 5027 is evacuated to a predetermined degree of vacuum through the vacuum piping 5029. Next, a high-purity inert gas is supplied through the supply piping 5030 to fill the vacuum container 5027 with the high-purity inert gas. When the pressure in the vacuum container 5027 has reached the same pressure as that in the container 5017, the gate valve 5028 is moved in the direction of the arrow C to move the sample 5002 into the container 5017. Then, the sample 5002 is placed at a predetermined position on the stage 5003 by a sample transfer mechanism (not shown). That is, after the sample 5002 has been inserted into the vacuum container 5027, the vacuum container 5027 is evacuated to a predetermined pressure. Then, a high-purity inert gas is introduced into the vacuum container 5027. Thereafter, the gate valve 5028 is opened, and the sample 5002 is placed on the stage 5003 in the container 5017 filled with the high-purity inert gas. Thereafter, the stage 5003 is moved to carry the sample 5002 to the charged particle beam irradiation area to perform processing with the charged particle beam.

Thus, the sample surface 5021 cleaned by evacuation is covered with a high-purity inert gas at all times during the transfer to the charged particle beam irradiation area. That is, after being cleaned by evacuation, the sample surface 5021 is not exposed to the atmospheric air. Accordingly, even when the sample 5002 is exposed to a vacuum environment again after being carried in the charged particle beam irradiation area, gas that may be released from the sample surface 5021 is only the high-purity inert gas covering the sample surface 5021. Therefore, the released gas is evacuated within an extremely short period of time, and the degree of vacuum at the charged particle beam irradiation area will not be degraded. Thus, it becomes easy to maintain the charged particle beam irradiation area at a high degree of vacuum, and it is also possible to minimize the likelihood that the sample surface 5021 may be contaminated.

Figure 27:
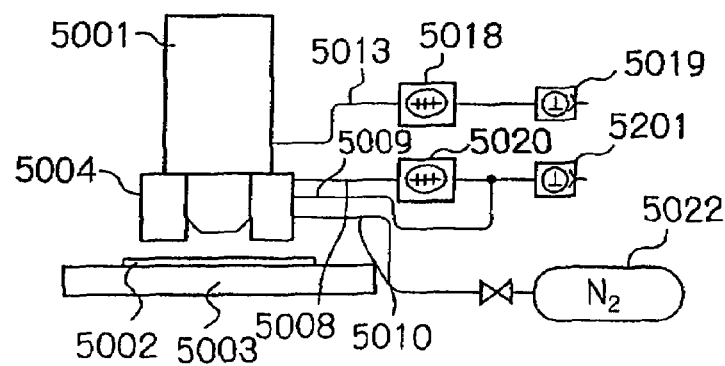
FIG. 27 is a diagram showing another modification of the differential pumping structure, the diagram illustrating an embodiment of an evacuation path.

FIG. 27 illustrates an embodiment of the evacuation path of the charged particle beam system. In this embodiment, piping 5013 for evacuating the column 5001 is connected to an ultrahigh vacuum pump 5018. Further, the piping 5008 for high vacuum of the differential pumping unit 5004 is connected to an ultrahigh vacuum pump 5020. The piping 5009 for low vacuum is connected to roughing piping of the ultrahigh vacuum pump 5020 and evacuated by a roughing pump 5201. Further, as a high-purity inert gas, for example, nitrogen gas is supplied to the differential pumping unit 5004 from a nitrogen gas source 5022 through piping 5010.

Figure 28:
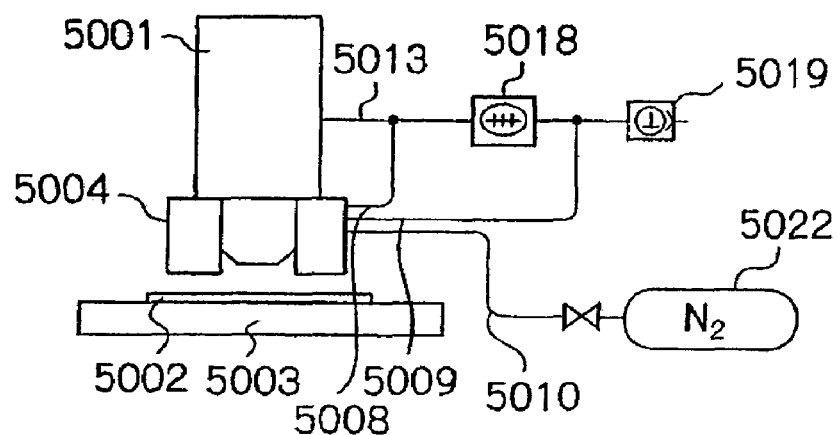
FIG. 28 is a diagram showing another modification of the differential pumping structure, the diagram illustrating a modification of the evacuation path.

FIG. 28 illustrates a modification of the evacuation path of the charged particle beam system. In this modification, the piping 5013 for evacuating the column 5001 and the piping 5008 for high vacuum of the differential pumping unit 5004 are joined together and connected to an ultrahigh vacuum pump 5018 so as to be evacuated by the ultrahigh vacuum pump 5018. Meanwhile, the piping 5009 for low vacuum of the differential pumping unit 5004 is connected to roughing piping of the ultrahigh vacuum pump 5018 and evacuated by a roughing pump 5019. With this arrangement, the number of vacuum pumps can be reduced in comparison to the embodiment shown in FIG. 27.

It should be noted that as the above-described ultrahigh vacuum pumps, for example, a turbo-molecular pump or an ion pump can be used. As the roughing pumps, for example, a dry pump or a diaphragm pump can be used.

Figure 29:
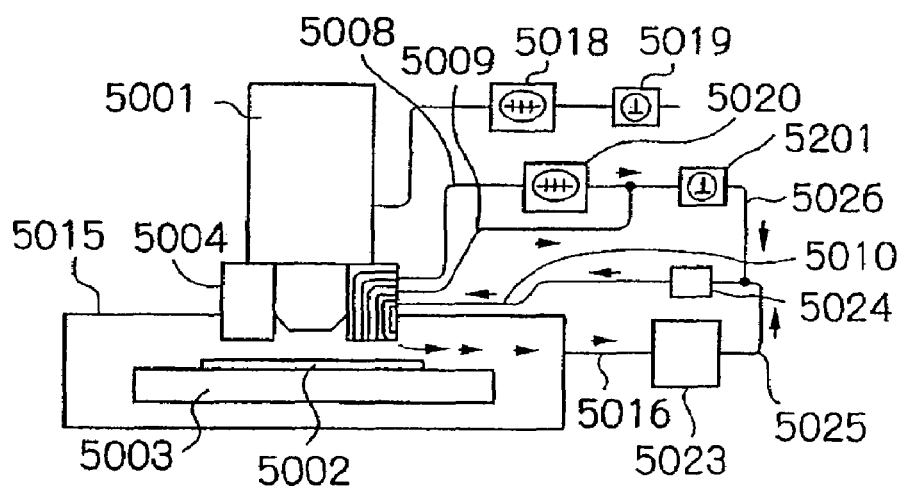
FIG. 29 is a diagram showing another modification of the differential pumping structure, the diagram illustrating an inert gas circulating path.

FIG. 29 is a diagram showing another modification of the charged particle beam system, which illustrates an inert gas circulating path. A container 5015 filled with a high-purity inert gas is supplied with the high-purity inert gas from a differential pumping unit 5004 provided on a column 5001. The supplied high-purity inert gas is evacuated from the container 5015 through a vacuum pipe 5016 and pressurized by a compressor 5023. The pressurized high-purity inert gas is sent to a gas purifier 5024, e.g. a cold trap or a high-purity filter, through piping 5025. After being purified, the high-purity inert gas is sent to the differential pumping unit 5004 again through piping 5010 and then supplied into the container 5015. The gas purifier 5024 need not be provided in a case where the gas can be circulated without deteriorating the purity.

The high-purity inert gas supplied from the differential pumping unit 5004 is sucked by a differential pumping mechanism and evacuated by an ultrahigh vacuum pump 5020 and a roughing pump 5201 through piping 5009 for low vacuum and piping 5008 for high vacuum. Piping 5026 provided at the evacuation side of the roughing pump 5201 is connected to the evacuation-side piping 5025 of the compressor 5023. Therefore, the high-purity inert gas passing through this path is also supplied to the differential pumping unit 5004 again through the piping 5010.

Thus, the high-purity inert gas can be circulated for reuse. Therefore, the high-purity inert gas can be economized. Further, because the high-purity inert gas is not discharged into the room where the present system is installed, it is possible to eliminate the danger of accident such as suffocation by the inert gas.

Figure 30:
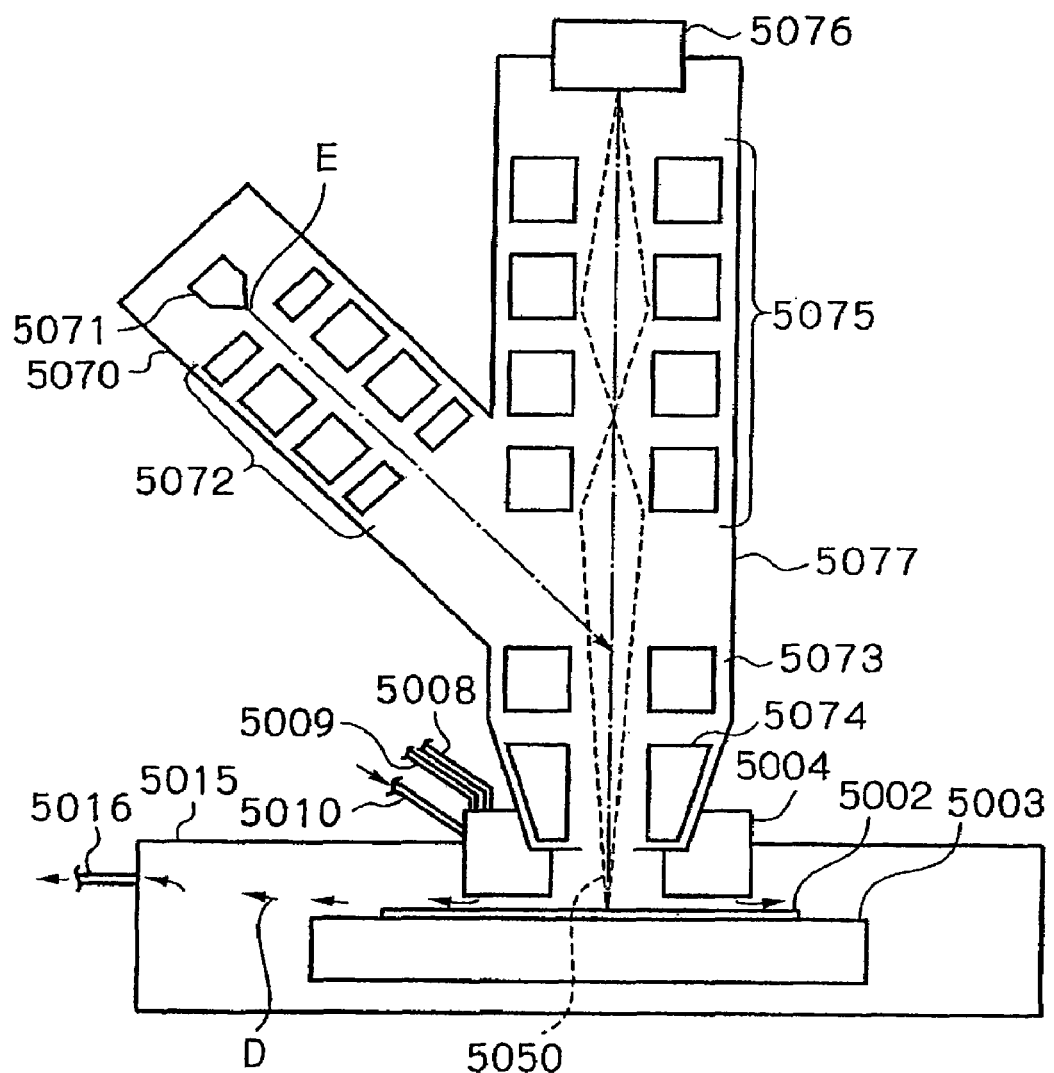
FIG. 30 is a diagram showing an arrangement in which a charged particle beam system according to another embodiment of the present invention is applied to a wafer defect inspection system.

Next, a modification in which the image projection type charged particle beam system according to this embodiment is applied to a wafer defect inspection system will be described with reference to FIG. 30.

In this modification, an electron beam E emitted from an electron gun 5071 in a column 5070 for a primary optical system passes through a lens unit 5072, thereby being shaped into a predetermined sectional configuration. The shaped electron beam (charged particle beam) 5050 enters a Wien filter 5073. The Wien filter 5073 deflect the path of the electron beam 5050 so that the electron beam 5050 is incident perpendicularly or normally on the surface of a wafer 5002 as a sample under inspection. As a result, secondary electrons are emitted from the sample surface. The secondary electrons are accelerated by an objective 5074 and travel straight through the Wien filter 5073. Thereafter, the secondary electrons are magnified and map-projected onto a detector 5076 by a lens unit 5075. The detector 5076 produces a projected image of secondary electrons. The image is subjected to image processing and, if necessary, compared with an image of another inspection region, thereby judging whether or not there is a defect on the wafer surface. The result of the judgment is recorded in a given device by a predetermined method and also displayed on a given device.

The arrangements and operations of a differential pumping unit 5004, a container 5015, vacuum piping 5008 and 5009, high-purity inert gas supply piping 5010, etc. are the same as those in the embodiments described above in connection with FIGS. 19 to 29. The high-purity inert gas flows through the container 5015 as indicated by the arrow D in the figure and is evacuated through a vacuum pipe 5016.

This embodiment provides the following advantageous effects:

(1) Only a place that requires a vacuum environment can be maintained under vacuum. Therefore, it is possible to use a stage designed for use in the atmospheric environment and hence possible to produce the charged particle beam system in a compact structure at reduced costs.

(2) It is possible to prevent particles from entering from the atmosphere side to adhere to the sample surface and also possible to reduce the number of opportunities for the sample to come in direct contact with the atmospheric air. Therefore, the sample, the charged particle beam optical system, etc. can be prevented from being contaminated by particles, water vapor, or other contaminants.

(3) Because the amount of gas released from the sample surface and the surfaces of the stage components into the vacuum environment can be reduced to a considerable extent, the charged particle beam irradiation area can be maintained at a high degree of vacuum.

(4) Because a stage designed for use in the atmospheric environment can be used as it is, a hydrostatic air bearing can be used for the stage guide. By combining with a high-precision actuator, e.g. a linear motor, the stage for the charged particle beam system can be improved in accuracy to the level of high-precision stages for use in the atmospheric environment, which are used in exposure systems and the like.

Next, an embodiment of the semiconductor device manufacturing method according to the present invention will be described with reference to FIGS. 31 and 32.

Figure 31:
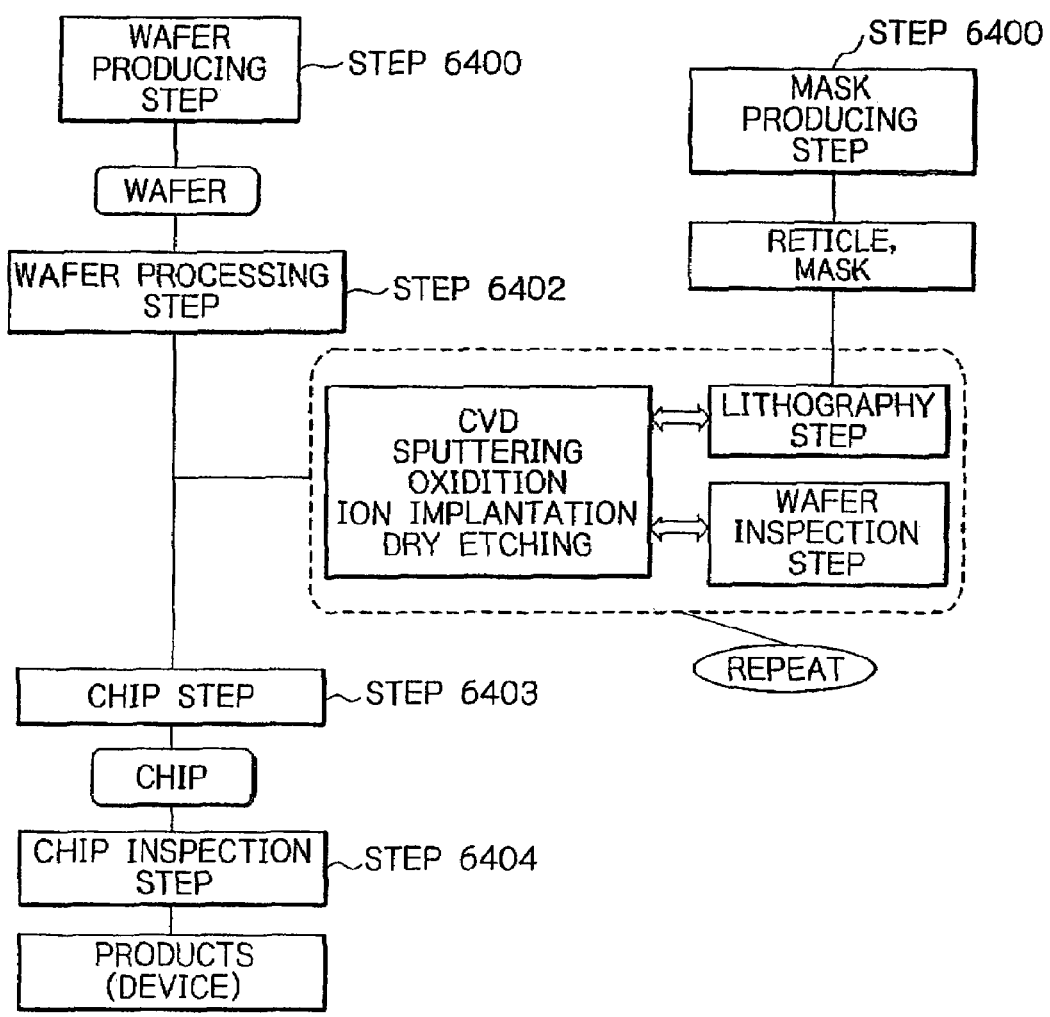
FIG. 31 is a flowchart showing an embodiment of a semiconductor device fabrication method according to the present invention.

FIG. 31 is a flowchart showing an embodiment of the semiconductor device fabrication method according to the present invention. The fabrication process of this embodiment includes the following main steps:

(1) A wafer producing step for producing a wafer (or a wafer preparing step for preparing a wafer)(step 6400).
(2) A mask producing step for producing a mask for use in lithography (or a mask preparing step for preparing a mask) (step 6401).
(3) A wafer processing step for subjecting the wafer to necessary processing treatment (step 6402).
(4) A chip fabricating step for cutting chips from the wafer one by one and making them operable (step 6403).
(5) A chip inspection step for inspecting the fabricated chips (step 6404).

It should be noted that each of the above-described main steps further includes some sub-steps.

Among the main steps, the wafer processing step (3) exerts a decisive influence upon the performance of the resulting semiconductor devices. At this step, designed circuit patterns are stacked successively on the wafer to form a multiplicity of chips operating as memories or MPU's. The wafer processing step includes the following steps:

(A) A thin-film forming step for forming a thin film, for example, a thin dielectric film serving as an insulating layer, or a thin metal film for forming wiring patterns or electrode patterns (using CVD, sputtering or the like).
(B) An oxidizing step for oxidizing the thin-film layer and the wafer substrate.
(C) A lithography step for forming a resist pattern using a mask (reticle) to selectively process the thin-film layer and the wafer substrate.
(D) An etching step for etching the thin-film layer and the substrate according to the resist pattern (using a dry etching technique, for example).
(E) An ion impurity implantation and diffusion step.
(F) A resist removing step.

(G) A step for inspecting the processed wafer.

It should be noted that the wafer processing step is repeated the number of times equal to the number of necessary layers to produce semiconductor devices that are operable as designed.

Figure 32:
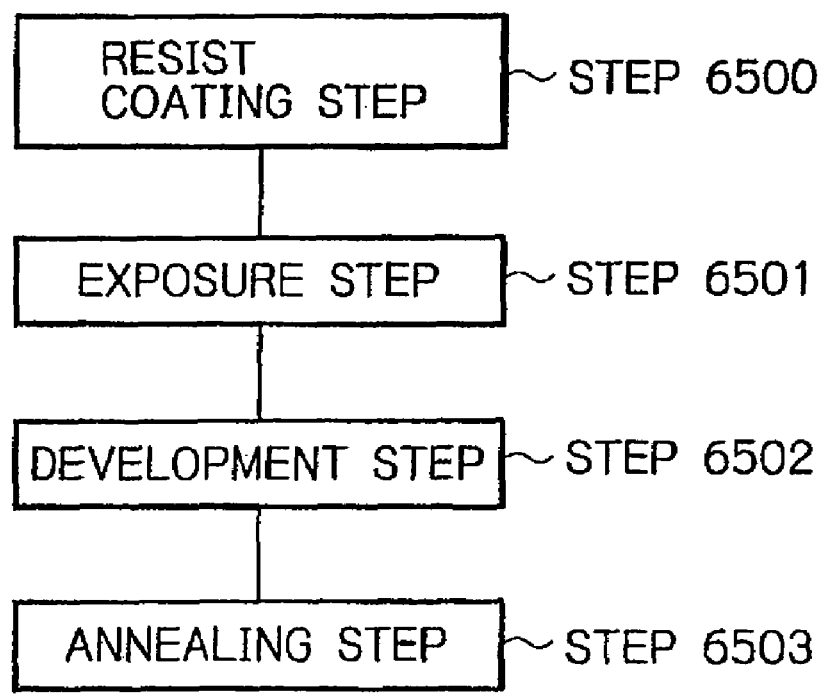
FIG. 32 is a flowchart showing a lithography step, which is at the core of a wafer processing step in FIG. 31.

FIG. 32 is a flowchart showing the lithography step, which is at the core of the wafer processing step in FIG. 31. The lithography step includes the following steps:

(a) A resist coating step for coating a resist over the wafer having a circuit pattern formed thereon at the preceding step (step 6500).
(b) A step for exposing the resist (step 6501).
(c) A development step for developing the exposed resist to obtain a resist pattern (step 6502).
(d) An annealing step for stabilizing the developed resist pattern (step 6503).

The above-described semiconductor device producing step, wafer processing step and lithography step are well known. Therefore, no further description thereof will be needed.

The use of the defect inspection method and defect inspection system according to the present invention in the inspection step (G) allows even semiconductor devices having fine patterns to be inspected with favorably high throughput. Accordingly, it becomes possible to perform 100% inspection and hence possible to improve the product yield and to prevent shipment of defective products.

The inspection procedure at the inspection step (G) will be described below.

Generally, a defect inspection system using an electron beam is costly and has low throughput in comparison to other process systems. In the present state of the art, therefore, the electron beam defect inspection system is used after an important fabrication step that is considered to be most in need of inspection [e.g. etching, film deposition (including plating), or CMP (Chemical/Mechanical Polishing) planarization treatment].

Figure 33:
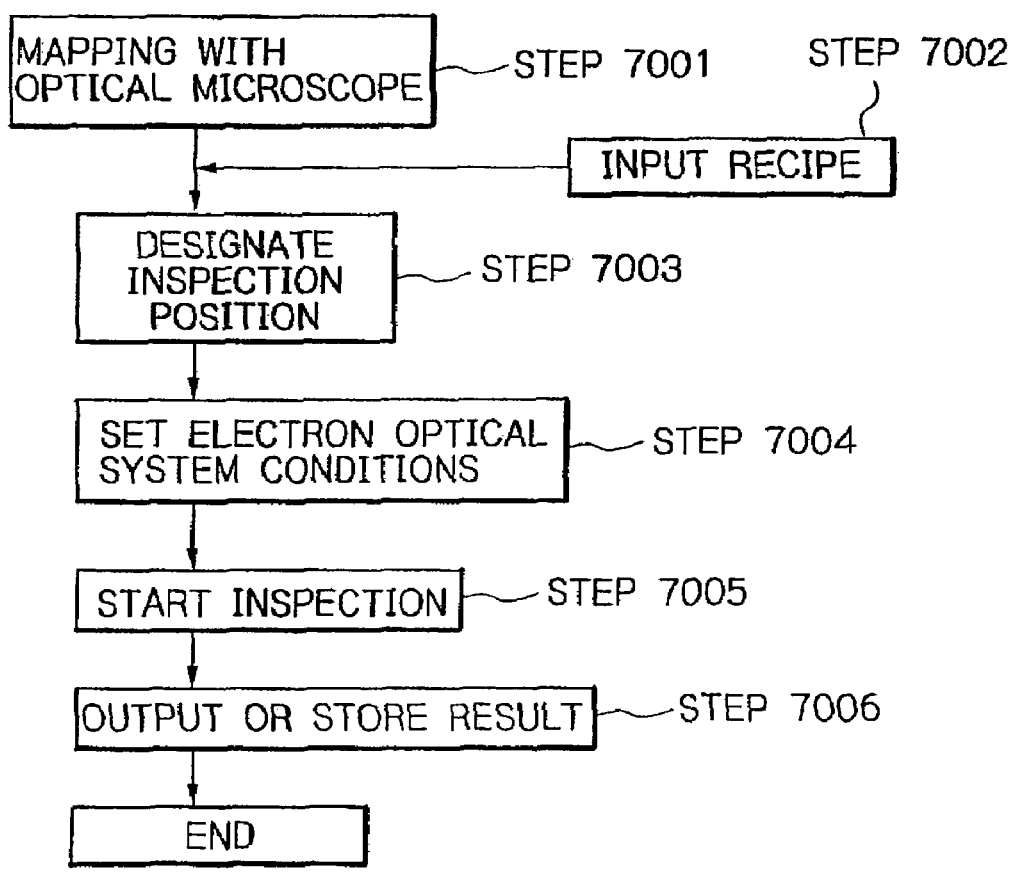
FIG. 33 is a flowchart showing an inspection procedure according to the present invention.

A wafer to be inspected is carried to an ultraprecision X-Y stage through an atmosphere transfer system and a vacuum transfer system and aligned on the stage. Thereafter, the wafer is secured by an electrostatic chuck mechanism or the like and then subjected to defect inspection or other processing according to the following procedure (i.e. the inspection flow shown in FIG. 33). First, the confirmation of the position of each die and the detection of the height of each position are performed according to need with an optical microscope, and information thus obtained is stored in a memory (step 7001). In addition, the optical microscope acquires an optical microscopic image of a region where defect inspection or the like is to be performed. The image thus obtained is used for comparison with an electron beam image. Next, information concerning a recipe is selected according to the type of inspection and the type of wafer (e.g. according to which step has been carried out just before the present inspection step, and whether the wafer size is 20 cm or 30 cm) and input to the system (step 7002). Then, designation of an inspection position (step 7003), setting of the electron optical system and setting of inspection conditions, and so forth are made (step 7004). Thereafter, a defect inspection is carried out in real time under normal circumstances while image acquisition is being performed (step 7005). Thus, inspection based on cell-to-cell comparison, die-to-die comparison, etc. is performed by a high-speed information processing system having an algorithm, and the result of the inspection is output to a CRT or the like and stored in a memory according to need (step 7006). Defects include particle defects, shape abnormalities (pattern defects), and electrical defects (disconnection and conduction failures of wiring patterns or vias, etc.). The system can also automatically distinguish between these defects and classify defect sizes and killer defects (serious defects that make the chip impossible to use) in real time. The detection of electrical defects is effected by detecting a contrast abnormality. For example, a conduction failure position is charged positively by electron beam irradiation (about 500 eV) under ordinary circumstances and consequently reduced in contrast. Therefore, it can be distinguished from a normal position. Electron beam irradiation devices used in this case include, in addition to an electron beam irradiation device for ordinary inspection, an electron beam emitter (a thermionic emitter or a UV/photoelectron emitter) for emitting an electron beam of low energy provided to enhance the contrast by an electric potential difference. Before the electron beam for inspection is applied to a region under inspection, the electron beam of low energy is emitted and irradiated to the region under inspection. In the case of the image projection type electron beam inspection system, a conduction failure position can be charged positively by irradiation with the electron beam for inspection. Therefore, in such a case, the device for generating an electron beam of low energy need not additionally be provided, depending upon the specifications. It is also possible to detect a defect from a difference in contrast produced by applying a positive or negative electric potential to a sample, e.g. a wafer, with respect to the reference electric potential (such a contrast difference is produced owing to the difference in electric flowability according to whether it is the forward direction or the backward direction of the device). This technique can also be used for line width measurement and alignment accuracy measurement.

As an inspection method for detecting electrical defects of a sample under inspection, it is also possible to make use of the fact that a portion that should be electrically insulated shows a difference in the electric potential measured when the portion is electrically insulated or when it is conducting.

First, an electric charge is given to the sample in advance so that there is a difference in electric potential between a portion that should be electrically insulated and a portion that should be electrically insulated but is conducting for some reason. Thereafter, a beam is applied to the sample by the method according to the present invention, thereby obtaining data containing the electric potential difference. Then, the data thus obtained is analyzed to detect the fact that the portion that should be electrically insulated is conducting.

In the foregoing embodiments, when an electron beam is generated, a target substance is floated by the proximity interaction (electrification of particles near the surface) and drawn to a high-electric potential area. Therefore, an organic material acting as an insulating material is deposited on the surfaces of various electrodes used to form and deflect the electron beam. The insulating material gradually deposited on the surface of an electrode as the electrode surface is electrically charged has an adverse effect on the formation of the electron beam or on the deflecting mechanism. Therefore, the deposited insulating material has to be removed periodically. Periodic removal of the deposited insulating material is carried out as follows. A plasma of hydrogen, oxygen, fluorine, or a compound containing such a substance, e.g. HF, $O_2$, $H_2O$, or $C_mF_n$, is produced in a vacuum by utilizing an electrode in the vicinity of an area where the insulating material is deposited, and the plasma electric potential in the space is maintained at an electric potential at which sputtering occurs on the electrode surface (several kV, e.g. 20 V to 5 kV), thereby removing only organic substances by oxidation, hydrogenation, or fluorination.

It should be noted that the present invention is not necessarily limited to the foregoing embodiments. For example, the elements of the described embodiments may be combined together as desired.

The term "inspection" as used in this application means not only the detection of presence of failures, e.g. defects, but also the evaluation of the inspection result.

The entire disclosure of Japanese Patent Applications Nos. 2001-2722 filed on Jan. 10, 2001, 2001-75865 filed on Mar. 16, 2001, 2001-92748 filed on Mar. 28, 2001, 2001-125349 filed on Apr. 24, 2001 and 2001-189325 filed on Jun. 25, 2001 including specification, claims, drawings and summary is incorporated herein by reference in its entirety.

What is claimed is:

1. A charged particle beam system for irradiating a charged particle beam to a surface of a sample placed on a stage, said charged particle beam system comprising:
   at least one differential pumping device which is provided on a leading end of a beam irradiating portion of said charged particle beam system and is arranged annularly around an irradiation area to be irradiated with the charged particle beam,
   the differential pumping device including:
   at least one annular portion for sucking air between the differential pumping device and the sample, and
   an inert gas blowing portion provided at an outer peripheral side of the annular sucking portion for blowing an inert gas around the sample to seal only said irradiation area and its vicinities with the inert gas to be maintained at a predetermined degree of vacuum.

2. A charged particle beam system according to claim 1, further comprising:
   a container filled with the inert gas, said container always covering a whole movable range of the stage for moving the sample to a predetermined position or a movable range of the sample.

3. A charged particle beam system according to claim 2, wherein said container filled with the inert gas is communicably connected with a vacuum container through a block valve so that the sample can come in and out of said container filled with the inert gas through said vacuum container.

4. A sample conveying method comprising the steps of:
   providing the charged particle beam system according to claim 3;
   inserting a sample into the vacuum container of said charged particle beam system and then evacuating said vacuum container to a predetermined pressure; and
   introducing an inert gas into said vacuum container and then opening the block valve and placing said sample on the stage in said container filled with the inert gas.

5. A wafer defect inspection system for inspecting a surface of a semiconductor wafer for a defect by using the charged particle beam system according to claim 3.

* * * * *